United States Patent
Iwai et al.

(10) Patent No.: US 11,631,623 B2
(45) Date of Patent: Apr. 18, 2023

(54) POWER SEMICONDUCTOR DEVICE AND METHOD OF MANUFACTURING THE SAME, AND POWER CONVERSION DEVICE

(71) Applicant: Mitsubishi Electric Corporation, Tokyo (JP)

(72) Inventors: Takamasa Iwai, Tokyo (JP); Junji Fujino, Tokyo (JP); Hiroshi Kawashima, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 177 days.

(21) Appl. No.: 17/267,987

(22) PCT Filed: Sep. 4, 2019

(86) PCT No.: PCT/JP2019/034816
§ 371 (c)(1),
(2) Date: Feb. 11, 2021

(87) PCT Pub. No.: WO2020/050325
PCT Pub. Date: Mar. 12, 2020

(65) Prior Publication Data
US 2021/0327777 A1 Oct. 21, 2021

(30) Foreign Application Priority Data

Sep. 6, 2018 (JP) .............................. JP2018-166901

(51) Int. Cl.
*H01L 23/28* (2006.01)
*H01L 23/29* (2006.01)
(Continued)

(52) U.S. Cl.
CPC .............. *H01L 23/29* (2013.01); *H01L 23/31* (2013.01); *H01L 23/367* (2013.01); *H01L 23/50* (2013.01);
(Continued)

(58) Field of Classification Search
CPC ....... H01L 23/28; H01L 23/29; H01L 23/367; H01L 23/495; H01L 23/49501; H01L 23/49503; H01L 24/48; H01L 2924/181
(Continued)

(56) References Cited

U.S. PATENT DOCUMENTS 5,409,866 A * 4/1995 Sato .................... H01L 21/4842
257/E23.047
5,648,680 A * 7/1997 Ogawa ................ H01L 23/4951
257/691

(Continued)

FOREIGN PATENT DOCUMENTS

JP   S5078863 A   6/1975
JP   S52008468 A   1/1977
(Continued)

OTHER PUBLICATIONS

Notice of Reasons for Refusal dated Mar. 8, 2022, issued in corresponding Japanese Patent Application No. 2020-541274, 11 pages including 6 pages of English Translation.
(Continued)

*Primary Examiner* — Nitin Parekh
(74) *Attorney, Agent, or Firm* — Buchanan Ingersoll & Rooney PC

(57) ABSTRACT

A lead member includes a plurality of lead terminals, and the lead terminals extend from the inside to the outside of a mold resin. Each of the lead terminals has a base portion and a tip end portion on the outside of the mold resin. The base portion is disposed on a region side having a semiconductor element and extends in a direction protruding from the mold resin. The tip end portion extends in a direction different from the base portion and is disposed on the opposite side to a region having the semiconductor element as viewed from the base portion. The length by which the base portion extends differs between a pair of lead terminals adjacent to
(Continued)

each other, among the lead terminals. At least a surface of the base portion of each of the lead terminals is covered with a coating resin.

14 Claims, 24 Drawing Sheets

(51) Int. Cl.
*H01L 23/31* (2006.01)
*H01L 23/367* (2006.01)
*H01L 23/50* (2006.01)
*H01L 23/00* (2006.01)
*H01L 25/07* (2006.01)
*H01L 25/18* (2023.01)

(52) U.S. Cl.
CPC .............. *H01L 24/48* (2013.01); *H01L 25/07* (2013.01); *H01L 25/18* (2013.01); *H01L 2224/48137* (2013.01); *H01L 2224/48247* (2013.01); *H01L 2924/181* (2013.01)

(58) Field of Classification Search
USPC .................................................. 257/666, 787
See application file for complete search history.

(56) References Cited

U.S. PATENT DOCUMENTS

| | | | | |
|---|---|---|---|---|
| 6,016,003 | A * | 1/2000 | Uemura | H01L 24/06 |
| | | | | 257/676 |
| 6,137,159 | A * | 10/2000 | Tsubosaki | H01L 23/4951 |
| | | | | 257/E23.079 |
| 6,297,545 | B1 * | 10/2001 | Sugiyama | H01L 24/05 |
| | | | | 257/676 |
| 6,479,322 | B2 * | 11/2002 | Kawata | H01L 24/05 |
| | | | | 438/109 |
| 2008/0290483 | A1 * | 11/2008 | Yurino | H01L 23/552 |
| | | | | 361/813 |
| 2014/0210093 | A1 | 7/2014 | Wang | |
| 2015/0303151 | A1 | 10/2015 | Kobayashi et al. | |
| 2015/0325505 | A1 * | 11/2015 | Wang | H01L 23/3135 |
| | | | | 438/123 |
| 2019/0067154 | A1 * | 2/2019 | Yoshihara | H01L 23/4006 |

FOREIGN PATENT DOCUMENTS

| | | |
|---|---|---|
| JP | S52068172 U | 5/1977 |
| JP | H01163343 U | 11/1989 |
| JP | H02161759 A | 6/1990 |
| JP | H04365360 A | 12/1992 |
| JP | 2007194451 A | 8/2007 |
| JP | 2010267794 A | 11/2010 |
| JP | 2012174776 A | 9/2012 |
| JP | 2013258334 A | 12/2013 |
| JP | 2014143373 A | 8/2014 |
| JP | 2014157897 A | 8/2014 |
| JP | 2018088558 A | 6/2018 |

OTHER PUBLICATIONS

International Search Report (with English Translation) and Written Opinion issued in corresponding International Patent Application No. PCT/JP2019/034816, 10 pages (dated Nov. 26, 2019).

Office Action dated Aug. 30, 2022 issued in corresponding Japanese Patent Application No. 2020-541274, 9 pages including 5 pages of English Translation.

* cited by examiner

POWER SEMICONDUCTOR DEVICE AND METHOD OF MANUFACTURING THE SAME, AND POWER CONVERSION DEVICE

TECHNICAL FIELD

The present invention relates to a power semiconductor device and a method of manufacturing the same, and a power conversion device, and more specifically to a power semiconductor device in which a semiconductor element placed on a lead member is sealed with mold resin, and a method of manufacturing the same, and a power conversion device having the power semiconductor device.

BACKGROUND ART

Power semiconductor devices have been widely used in all sorts of products, from industrial devices to home appliances and information terminals. Power semiconductor devices in particular need to be miniaturized. Power semiconductor devices, however, handle high voltage and large current. This requires an insulation distance between lead terminals, an insulation distance between a lead terminal and a cooling member external to the power semiconductor device, or an insulation distance between a die pad having a power semiconductor element thereon and a cooling member external to the power semiconductor device. Because of this situation, there is a limitation in miniaturization of power semiconductor devices. Moreover, the power semiconductor device requires high heat dissipation from the die pad to the external cooling member. Both insulation and heat dissipation are thus required at the same time.

For example, in Japanese Patent Laying-Open No. 2-161759 (PTL 1), in a resin-sealed semiconductor device, a lead terminal exposed on the outside of a resin mold is coated with resin. The coating resin ensures insulation between a pair of lead terminals adjacent to each other.

CITATION LIST

Patent Literature

PTL 1: Japanese Patent Laying-Open No. 2-161759

SUMMARY OF INVENTION

Technical Problem

As disclosed in Japanese Patent Laying-Open No. 2-161759, which is characterized in that the lead terminals are only coated with resin, the distance between a pair of lead terminals adjacent to each other may be small with respect to the direction in which a plurality of lead terminals are aligned. Therefore, when the power semiconductor device in Japanese Patent Laying-Open No. 2-161759 is mounted on a substrate, the soldered portions of the lead terminals may be short-circuited.

The present invention is made in view of the aforementioned problem. An object of the present invention is to provide a power semiconductor device and a method of manufacturing the same, and a power conversion device, in which even when the distance between a pair of lead terminals adjacent to each other is short with respect to the direction in which a plurality of lead terminals are aligned, short-circuiting of the soldered portions of the pair of lead terminals is suppressed.

Solution to Problem

A power semiconductor device according to the present invention includes a lead member, a semiconductor element, and a mold resin. The lead member includes a plurality of lead terminals, and the lead terminals extend from inside to outside of the mold resin. Each of the lead terminals includes a base portion and a tip end portion on the outside of the mold resin. The base portion is disposed on a region side having the semiconductor element and extends in a direction protruding from the mold resin. The tip end portion extends in a direction different from the base portion and is disposed on an opposite side to a region having the semiconductor element as viewed from the base portion. A length by which the base portion extends differs between a pair of lead terminals adjacent to each other, among the lead terminals. At least a surface of the base portion of each of the lead terminals is covered with a coating resin.

In a method of manufacturing a power semiconductor device according to the present invention, a semiconductor element is sealed with resin, in a state in which the semiconductor element is placed on a lead member. A coating resin is formed for a member including the semiconductor element sealed with resin. The lead member is cut into a plurality of lead terminals, and the lead terminals extend from inside to outside of a mold resin formed of the resin. Each of the cut lead terminals includes a base portion and a tip end portion on the outside of the mold resin. The base portion is disposed on a region side having the semiconductor element and extends in a direction protruding from the mold resin. The tip end portion extends in a direction different from the base portion and is disposed on an opposite side to a region having the semiconductor element as viewed from the base portion. A length by which the base portion extends differs between a pair of lead terminals adjacent to each other, among the lead terminals. At least a surface of the base portion of each of the lead terminals is covered with the coating resin in forming the coating resin. In forming the coating resin, a charged resin material diffused into a spray adheres to a surface of the base portion.

Advantageous Effects of Invention

According to the present invention, the length by which the base portion of the lead terminal extends differs between a pair of lead terminals adjacent to each other, and the surface of the base portion is covered with the coating resin. In this configuration, even when the distance between a pair of lead terminals adjacent to each other with respect to the direction in which the lead terminals are aligned is short, the distance between the soldered portions of the pair of lead terminals is long. This suppresses short-circuiting between the soldered portions. Accordingly, the power semiconductor device can be miniaturized.

DESCRIPTION OF EMBODIMENTS

Embodiments of the present invention will be described below with reference to the drawings.

First Embodiment

Figure 3:
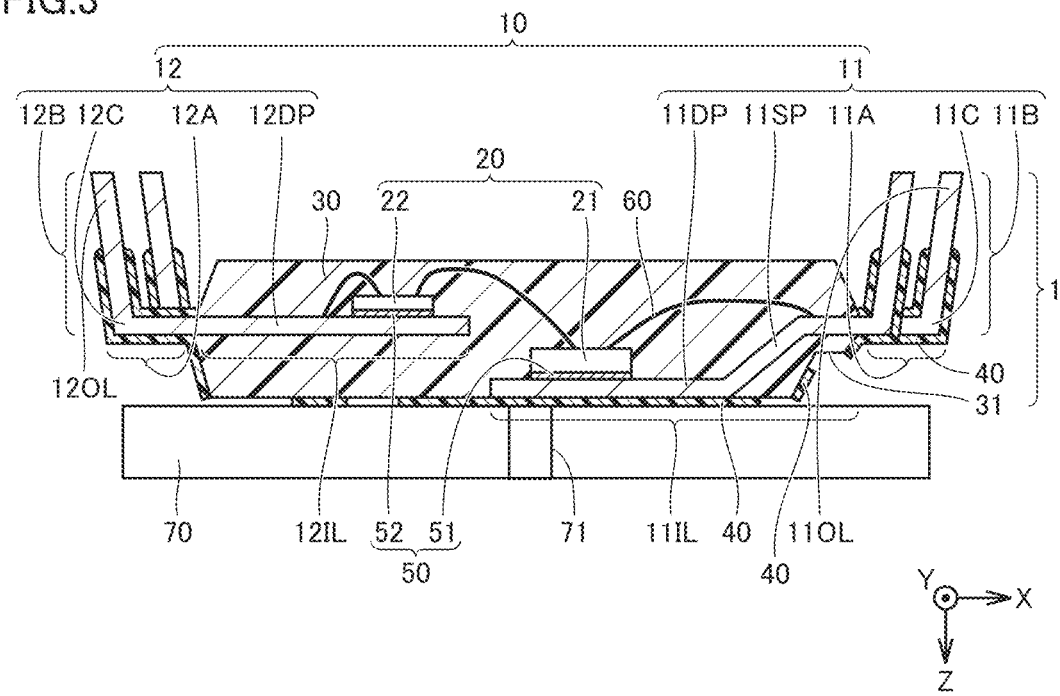
FIG. 3 is a schematic cross-sectional view showing the power semiconductor device according to a first modification of the first embodiment equipped with the cooling member.
Figure 4:
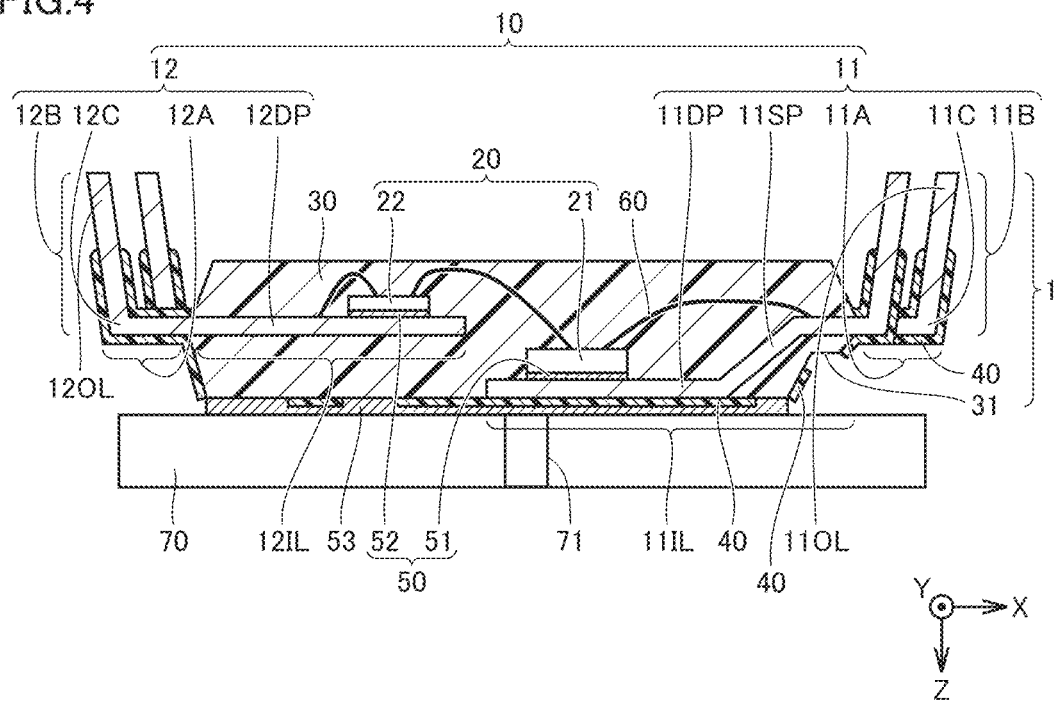
FIG. 4 is a schematic cross-sectional view showing the power semiconductor device according to a second modification of the first embodiment equipped with the cooling member.
Figure 5:
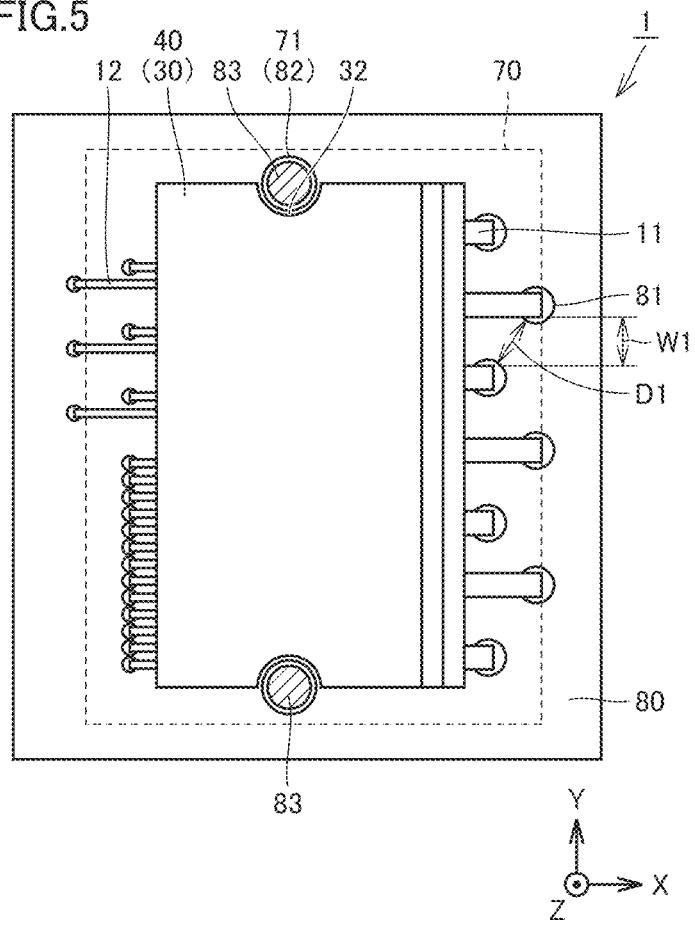
FIG. 5 is a schematic plan view showing the power semiconductor device in FIG. 1 turned upside down and mounted on a circuit board.
Figure 6:
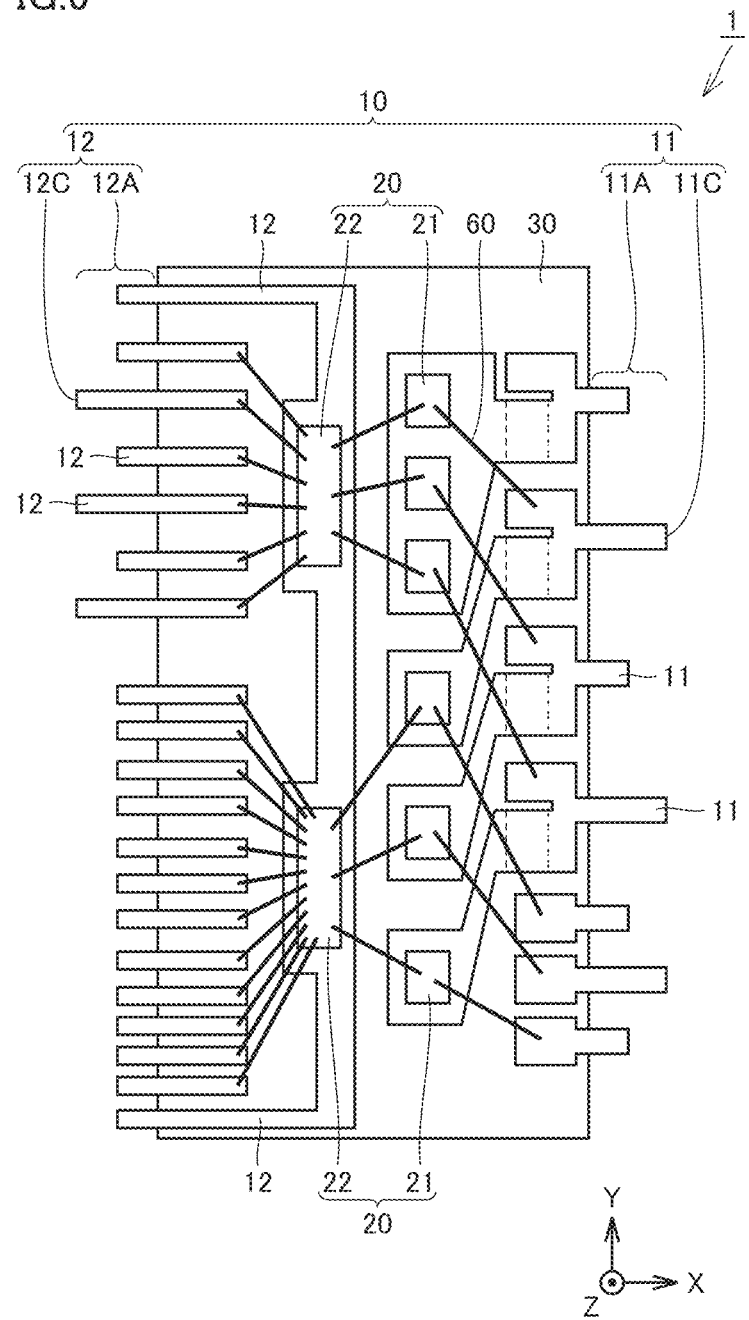
FIG. 6 is a schematic plan view showing the inside of mold resin in the power semiconductor device in FIG. 5.

First of all, a configuration of a power semiconductor device in the present embodiment will be described with reference to FIG. 1 to FIG. 7. The X direction, the Y direction, and the Z direction are introduced for convenience of explanation. As indicated by the Z axis in each drawing in FIG. 1 to FIG. 7, the lower side is the Z-direction positive side in FIG. 1, whereas the upper side is the Z-direction positive side in FIG. 2 and FIG. 7. In FIG. 5 and FIG. 6, the front side of the drawing sheet, that is, the upper side in a two-dimensional view is the Z-direction positive side.

Figure 1:
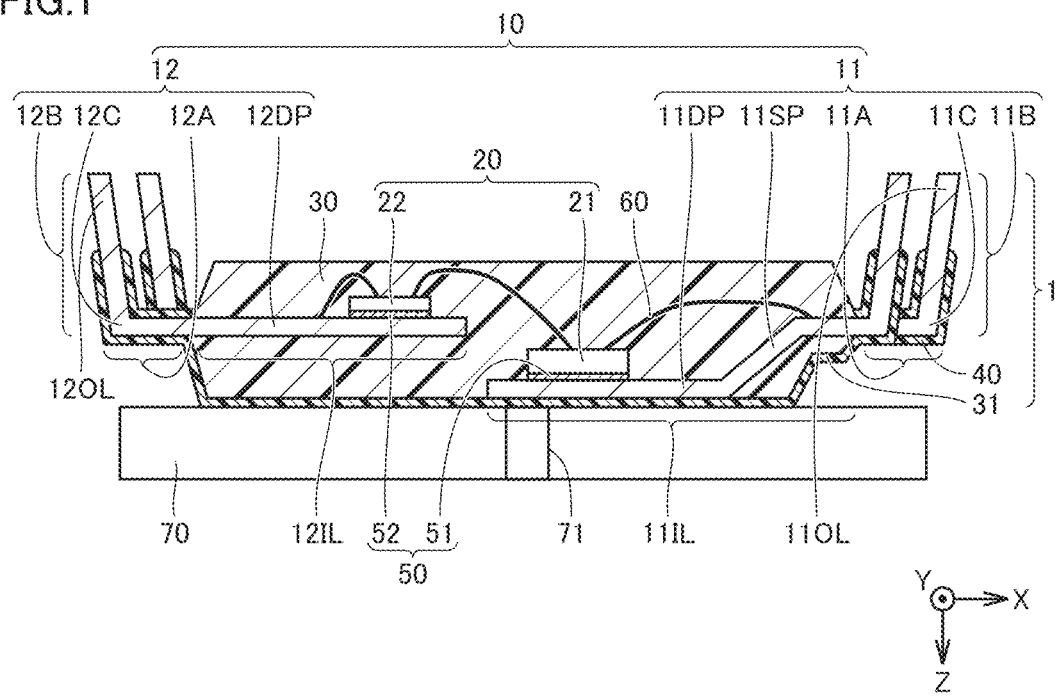
FIG. 1 is a schematic cross-sectional view showing a power semiconductor device according to a first embodiment equipped with a cooling member.
Figure 2:
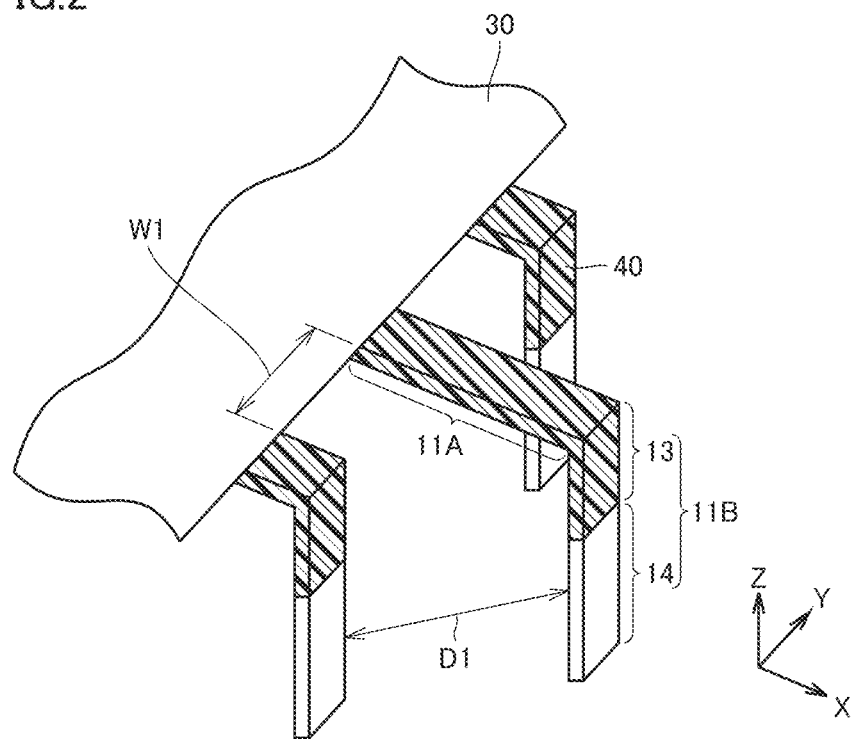
FIG. 2 is an enlarged perspective view schematically showing a lead member extracted from the power semiconductor device according to the first embodiment.
Figure 7:
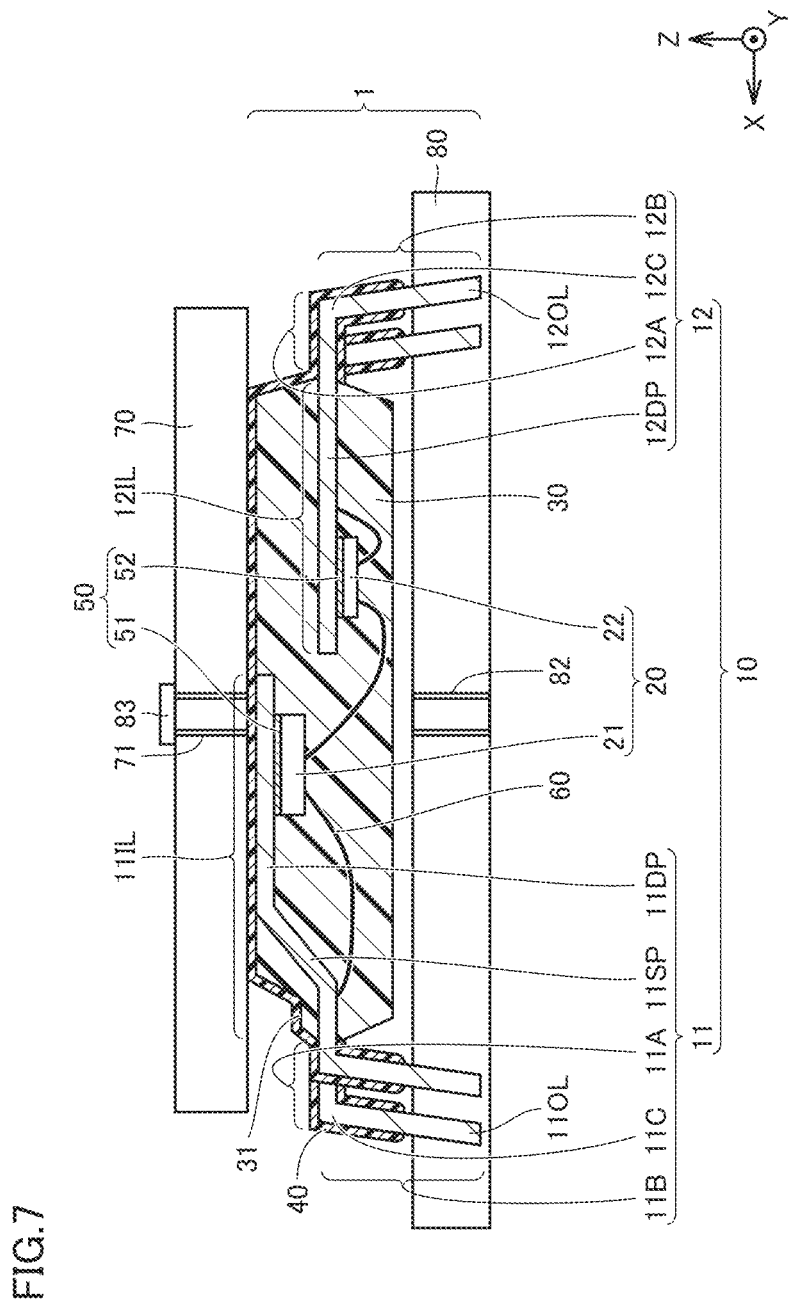
FIG. 7 is a schematic cross-sectional view showing the overview of the power semiconductor device in FIG. 1 mounted on a circuit board.

FIG. 1 is a schematic cross-sectional view showing a power semiconductor device according to a first embodiment equipped with a cooling member. FIG. 2 is an enlarged perspective view schematically showing a lead member extracted from the power semiconductor device according to the first embodiment. FIG. 3 is a schematic cross-sectional view showing the power semiconductor device according to a first modification of the first embodiment equipped with the cooling member. FIG. 4 is a schematic cross-sectional view showing the power semiconductor device according to a second modification of the first embodiment equipped with the cooling member. FIG. 5 is a schematic plan view showing the power semiconductor device in FIG. 1 turned upside down and mounted on a circuit board. FIG. 6 is a schematic plan view showing the inside of mold resin in the power semiconductor device in FIG. 5. FIG. 7 is a schematic cross-sectional view showing the overview of the power semiconductor device in FIG. 1 mounted on a circuit board. First, referring to FIG. 1 to FIG. 7, an overall configuration of the power semiconductor device in the present embodiment will be described.

Referring to FIG. 1, a power semiconductor device 1 in the present embodiment mainly includes a lead member 10, a semiconductor element 20, and a mold resin 30. Lead member 10 is a member originally formed as a lead frame. That is, lead member 10 is a conductive member formed by partially bending a flat plate-shaped member. Lead member 10 includes a power lead terminal 11 and an integrated circuit lead terminal 12 as lead terminals. Hereinafter, these may be simply referred to as lead terminal 11 and lead terminal 12. A plurality of power lead terminals 11 and a plurality of integrated circuit lead terminals 12 are provided in a single power semiconductor device 1. Semiconductor element 20 is a member placed on lead member 10. Semiconductor element 20 includes a power semiconductor element 21 and an integrated circuit element 22. Power semiconductor element 21 is a semiconductor chip on which a high-power semiconductor element such as an IGBT (Insulated Gate Bipolar Transistor) is mounted. Integrated circuit element 22 is a semiconductor chip on which an element having a function of driving the IGBT, such as a MOSFET (Metal Oxide Semiconductor Field Effect Transistor), is mounted. Mold resin 30 is a member that seals semiconductor element 20 in its inside and seals a part of lead member 10 on which semiconductor element 20 is mounted.

Power lead terminal 11 and integrated circuit lead terminal 12 each extend from the inside to the outside of mold resin 30. That is, power lead terminal 11 has an inner lead portion 11IL arranged inside mold resin 30 and an outer lead portion 11OL arranged outside mold resin 30. Integrated circuit lead terminal 12 has an inner lead portion 12IL arranged inside mold resin 30 and an outer lead portion 12OL arranged outside mold resin 30.

Inner lead portion 11IL of power lead terminal 11 has a die pad portion 11DP and a step portion 11SP. Power semiconductor element 21 is placed on a surface of die pad portion 11DP of lead member 10. Specifically, die pad portion 11DP is arranged such that it has a surface generally along the XY plane. Power semiconductor element 21 is bonded by conductive adhesive 51 on the upper surface (the surface on the Z-direction negative side) of die pad portion 11DP in FIG. 1.

Inner lead portion 12IL of integrated circuit lead terminal 12 includes a die pad portion 12DP. Integrated circuit element 22 is placed on a surface of die pad portion 12DP of lead member 10. Specifically, die pad portion 12DP is arranged such that it has a surface generally along the XY plane. Integrated circuit element 22 is bonded by conductive adhesive 52 on the upper surface (the surface on the Z-direction negative side) of die pad portion 12DP in FIG. 1. In this way, each of a plurality of lead terminals 11 has die pad portion 11DP on which power semiconductor element 21 is placed. Each of a plurality of lead terminals 12 has die pad portion 12DP on which integrated circuit element 22 is placed.

Die pad portion 11DP of inner lead portion 11IL is arranged below die pad portion 12DP of inner lead portion 12IL in FIG. 1, that is, on the side on which coating resin 40 described later is formed and external cooling member 70 is arranged. Integrated circuit lead terminal 12 receives a relatively low voltage or is grounded. By contrast, power lead terminal 11 receives a high voltage compared with integrated circuit lead terminal 12. With the configuration as described above, the distance between power lead terminal 11 and integrated circuit lead terminal 12 can be increased. This can suppress short-circuiting between lead terminal 11 and lead terminal 12 and improve insulation between them. An even higher voltage can be applied to power lead terminal 11.

However, die pad portion 11DP of inner lead portion 11IL and die pad portion 12DP of inner lead portion 12IL may be arranged at substantially the same height with respect to the Z direction. In this manner, the step of bending power lead terminal 11 to provide step portion 11SP can be eliminated, and a lower cost can be expected.

Outer lead portion 11OL of a plurality of power lead terminals 11 has a base portion 11A, a tip end portion 11B, and a turn portion 11C. Base portion 11A is outer lead portion 11OL on the side proximate to inner lead portion 11IL. In other words, base portion 11A is arranged on the outside of mold resin 30, on the region side in which power semiconductor element 21 is placed, that is, on the side closer to inner lead portion 11IL with respect to its extending direction. Base portion 11A extends in contact with the outermost portion of mold resin 30, that is, has its base end at mold resin 30. Base portion 11A extends in a direction protruding from mold resin 30, that is, in a direction in which it is exposed to the outside of mold resin 30 in a two-dimensional view. As shown in FIG. 1, power lead terminal 11 has a plane inclined relative to the XY plane at step portion 11SP. Power lead terminal 11, however, has a plane along the XY plane on both sides sandwiching step portion 11SP, that is, on the left side and the right side in FIG. 1. That is, a region adjacent to step portion 11SP on the opposite side to power semiconductor element 21 (an adjacent region on the outside in a two-dimensional view) is not bent but extends as it is from the inside to the outside of mold resin 30. In this region, a region on the outside of mold resin 30 is base portion 11A.

Since power lead terminal 11 has step portion 11SP, the position of inner lead portion 11IL, specifically, die pad portion 11DP is different from the position of base portion 11A of outer lead portion 11OL with respect to the Z direction. Specifically, each of a plurality of power lead terminals 11 has step portion 11SP between die pad portion 11DP and base portion 11A, at inner lead portion 11IL inside mold resin 30. Each of a plurality of power lead terminals 11 is bent at step portion 11SP. Because of the bending of a plurality of power lead terminals 11, in FIG. 1, die pad portion 11DP is arranged on the opposite side to tip end portion 11B described later as viewed from base portion 11A, that is, at a lower position in FIG. 1, compared with base portion 11A. Compared with base portion 11A, die pad portion DP is arranged the lower side, that is, the positive side of the Z direction that is the surface side opposite to the upper surface in FIG. 1 on which the power semiconductor element 21 is placed. Thus, for example, compared with when the position of die pad portion 11DP and the position of base portion 11A are substantially equal in the Z direction, the creepage distance between die pad portion 11DP and base portion 11A can be increased. This improves the insulation performance between outer lead portion 11OL and another member in contact with die pad portion 11DP described later, such as external cooling member 70.

Furthermore, a mold resin step portion 31 may be formed at the outer surface of mold resin 30 adjacent to the above-noted step portion 11SP. Mold resin step portion 31 is formed such that the outer surface of mold resin 30 is partially bent. Mold resin step portion 31 is a region in which the direction in which its outer surface extends and expands is different from that of a region surrounding the region in which the outer surface of mold resin 30 is partially bent, that is, mold resin step portion 31. When mold resin step portion 31 is formed, the creepage distance of the outer surface of the mold resin 30 from outer lead portion 11OL to external cooling member 70 described later is longer, compared with when it is not formed. This can further improve the insulation performance between outer lead portion 11OL of power lead terminal 11 and external cooling member 70, or the like.

Mold resin step portion 31 is formed at a surface portion of mold resin 30 adjacent to step portion 11 SP, that is, power lead terminal 11. However, the present invention is not limited thereto. Mold resin step portion 31 may be formed at a surface portion of mold resin 30 adjacent to integrated circuit lead terminal 12. In this case, integrated circuit lead terminal 12 may also have a step portion similar to step portion 11SP.

Tip end portion 11B is arranged on the opposite side of base portion 11A in outer lead portion 11OL relative to a region in which power semiconductor element 21 is placed, that is, die pad portion 11DP. Tip end portion 11B is outer lead portion 11OL on the farther side from inner lead portion 11IL than base portion 11A is. Tip end portion 11B has a plane generally along the YZ plane in FIG. 1. In other words, tip end portion 11B extends in a direction different from base portion 11A. The portion at which the extending and expanding direction turns from tip end portion 11B to base portion 11A is turn portion 11C. Turn portion 1C is a portion located at the boundary between base portion 11A and tip end portion 11B, where outer lead portion 11OL is bent such that its extending and expanding direction turns, that is, a direction-turning portion. In outer lead portion 11OL, base portion 11A is arranged on the side closer to inner lead portion 11IL than turn portion 11C is, that is, on the side on which semiconductor element 21 is arranged. Conversely, in outer lead portion 11OL, tip end portion 11B is arranged on the opposite side of base portion 11A, from turn portion 11C, relative to a region where power semiconductor element 21 is placed. In other words, tip end portion 11B extends in a direction different from the direction along the XY plane in which base portion 11A extends, that is, for example, in the direction along the Z direction, and is arranged on the opposite side to a region in which power semiconductor element 21 is placed as viewed from base portion 11A.

Outer lead portion 12OL of a plurality of integrated circuit lead terminals 12 has a base portion 12A, a tip end portion 12B, and a turn portion 12C. Base portion 12A is outer lead portion 12OL on the side proximate to inner lead portion 12IL. In other words, base portion 12A is arranged on the outside of mold resin 30, on the side closer to a region in which integrated circuit element 22 is placed, that is, on the side closer to inner lead portion 12IL. Base portion 12A extends in contact with the outermost portion of mold resin 30, that is, has its base end at mold resin 30. Base portion 12A extends in a direction protruding from mold resin 30, that is, in a direction toward the outside of mold resin 30 in a two-dimensional view. As shown in FIG. 1, integrated circuit lead terminal 12 has a region having a plane along the XY plane from inner lead portion 12IL to base portion 12A without bending. That is, a region adjacent to inner lead portion 12IL on the opposite side to integrated circuit element 22 (an adjacent region on the outside in a two-dimensional view) is not bent but extends as it is from the inside to the outside of mold resin 30. In this region, a region on the outside of mold resin 30 is base portion 12A.

Tip end portion 12B is arranged on the opposite side of base portion 12A of outer lead portion 12OL relative to a region in which integrated circuit element 22 is placed, that is, die pad portion 12DP. Tip end portion 12B is outer lead portion 12OL on the side farther from inner lead portion 12IL than base portion 12A is. Tip end portion 12B has a plane generally along the YZ plane in FIG. 1. In other words, tip end portion 12B extends in a direction different from base portion 12A. The portion at which the extending and expanding direction turns from tip end portion 12B to base portion 12A is turn portion 12C. Turn portion 12C is a portion located at the boundary between base portion 12A and tip end portion 12B, where outer lead portion 12OL is bent such that its extending and expanding direction turns. In outer lead portion 12OL, base portion 12A is arranged on the side closer to inner lead portion 12IL than turn portion 12C is, that is, on the side on which integrated circuit element 22 is arranged. Conversely, in outer lead portion 12OL, tip end portion 12B is arranged on the opposite side of base portion 12A, from turn portion 12C, relative to a region in which integrated circuit element 22 is placed. In other words, tip end portion 12B extends in a direction different from the direction along the XY plane in which base portion 12A extends, that is, for example, in the direction along the Z direction, and is arranged on the opposite side to a region in which integrated circuit element 22 is placed as viewed from base portion 12A.

Referring to FIG. 1 and FIG. 2, a plurality of power lead terminals 11 are spaced apart from each other with a spacing W1 with respect to the Y direction. Between a pair of power lead terminals 11 adjacent to each other with spacing W1 in the Y direction, the lengths of base portions 11A extending in the X direction are different from each other. In FIG. 2, compared with power lead terminal 11 on the forefront side with respect to the Y direction, power lead terminal 11 adjacent thereto has a longer base portion 11A. Power lead terminal 11 adjacent to power lead terminal 11 with long base portion 11A on the back side in the Y direction has a shorter base portion 11A. Its length is substantially equal to the length of base portion 11A of power lead terminal 11 on the forefront side in the Y direction. Thus, the distance D1 between tip end portions 11B of a pair of power lead terminals 11 adjacent with spacing W1 from each other with respect to the Y direction is larger than spacing W1. The foregoing is applicable to integrated circuit lead terminal 12.

At least the surface of base portion 11A of each of a plurality of power lead terminals 11 is covered with coating resin 40. In other words, as shown in FIG. 2, the surface of base portion 11A and turn portion 11C of power lead terminal 11, and the surface of a region of tip end portion 11B on the side closer to base portion 11A are a covering portion 13 covered with coating resin 40. On the other hand, in tip end portion 11B of power lead terminal 11, the surface of a region on the side distant from base portion 11A is an exposed portion 14 not covered with coating resin 40. The foregoing is applicable to integrated circuit lead terminal 12.

As shown in FIG. 1, coating resin 40 is formed so as to be continuous from the surface of base portion 11A to the surface on the opposite side to the upper surface in FIG. 1 on which power semiconductor element 21 is placed, that is, on the lower surface of die pad portion 11DP of power lead terminal 11 on which power semiconductor element 21 is placed. Coating resin 40 is therefore formed on die pad portion 11DP. In order to enable this, the lower surface in FIG. 1 of die pad portion 11DP is exposed from mold resin 30. Coating resin 40 at die pad portion 11DP is formed on the lower surface in FIG. 1 on the opposite side to the surface on which power semiconductor element 21 is placed. As shown in FIG. 1, coating resin 40 at die pad portion 11DP may be formed only on the lower surface of die pad portion 11DP on the opposite side to the surface on which power semiconductor element 21 is placed. However, coating resin 40 at die pad portion 11DP may be formed even on the upper surface in FIG. 1 of die pad portion 11DP that is the surface side on which power semiconductor element 21 is placed. Coating resin 40 may be continuous from the lower surface of base portion 11A to the lower surface of die pad portion 11DP. At a portion between the lower surface of base portion 11A and the lower surface of die pad portion 11DP, coating resin 40 may be arranged so as to extend along, that is, cover the lower surface of power lead terminal 11. However, as shown in FIG. 1, at the portion between the lower surface of base portion 11A and the lower surface of die pad portion 11DP, coating resin 40 may be arranged so as to cover the surface of mold resin 30. In FIG. 1, coating resin 40 may be arranged on the surface of lead terminal 11 as described above. This is applicable to the example in FIG. 3 and FIG. 4 which will be described next.

Referring to FIG. 3, coating resin 40 may be formed at least partially from the surface of base portion 11A to the lower surface on the opposite side to the upper surface of die pad portion 11DP on which power semiconductor element 21 is placed. In other words, coating resin 40 may be formed intermittently, rather than continuously, in a region from the surface of base portion 11A to the lower surface on the opposite side to the upper surface of die pad portion 11DP on which power semiconductor element 21 is placed. However, coating resin 40 may be formed continuously, as shown in FIG. 1, in a region from the surface of base portion 11A to the lower surface on the opposite side to the upper surface of die pad portion 11DP on which power semiconductor element 21 is placed. In FIG. 3, at the portion between the lower surface of base portion 11A and the lower surface of die pad portion 11DP, coating resin 40 may be arranged so as to extend along, that is, cover the lower surface of power lead terminal 11, in the same manner as in FIG. 1. However, as shown in FIG. 1, at the portion between the lower surface of base portion 11A and the lower surface of die pad portion 11DP, coating resin 40 may be arranged so as to cover the surface of mold resin 30.

The lower surface in FIG. 1 of die pad portion 11DP is arranged on the same plane as, that is, in flush with, the lower surface in FIG. 1 of mold resin 30. Coating resin 40 is therefore formed so as to cover a part of the surface of mold resin 30, specifically, the lower surface in FIG. 1. On this surface, as shown in FIG. 1, for example, external cooling member 70 may be fixed. However, referring to FIG. 4, particularly when coating resin 40 is formed intermittently only on a part of the region from base portion 11A to die pad portion 11DP as shown in FIG. 3, a heat dissipation member 53 may be sandwiched between die pad portion 11DP and external cooling member 70. Even in the example in which coating resin 40 is formed continuously through the entire region from base portion 11A to die pad portion 11DP as shown in FIG. 1, heat dissipation member 53 may be sandwiched in the same manner as in FIG. 4. Heat dissipation member 53 is a thin layer formed of, for example, heat dissipation grease.

Referring to FIG. 1, FIG. 2, and FIG. 5, lead member 10 oriented upward in FIG. 1 and oriented downward in FIG. 2, specifically, the tip end portions of power lead terminal 11 and integrated circuit lead terminal 12 are inserted to penetrate a plurality of though holes 81 of a circuit board 80 shown in FIG. 5. That is, tip end portion 11B and tip end portion 12B oriented downward as shown in FIG. 2 are inserted from the upper side to the lower side in a two-dimensional view of circuit board 80 in FIG. 5. That is, power semiconductor device 1 in the present embodiment includes circuit board 80. In other words, in power semiconductor device 1, a section including lead member 10, semiconductor element 20, and mold resin 30 is mounted on circuit board 80. In other words, here, it is assumed that circuit board 80 is included in power semiconductor device 1.

As described above, tip end portions 11B, 12B of lead terminals 11, 12 are inserted into through holes 81 and fixed by solder. This solder wets the surface of exposed portions 14 of tip end portions 11B, 12B not covered with coating resin 40 and thereby fixes circuit board 80 and lead member 10. A plurality of lead terminals 11, 12 are inserted and bonded by solder, whereby through holes 81 of circuit board 80 are electrically continuous with a plurality of lead terminals 11, 12. Thus, the section including mold resin 30 of power semiconductor device 1 is mounted on circuit board 80.

A plurality of lead terminals 11, 12 differ (at least partially) in length by which adjacent base portions 11A, 12A extend. For this reason, through holes 81 receiving them are formed in a staggered arrangement in a two-dimensional view of circuit board 80. That is, straight lines each connecting those adjacent to each other, among a plurality of through holes 81, extend diagonally to both the X direction and the Y direction. Thus, when connected, these lines form a zigzag pattern.

FIG. 6 shows a two-dimensional manner of the inside of mold resin 30 covered with coating resin 40 in a plan view of FIG. 5. Referring to FIG. 5, FIG. 6, and FIG. 1, among a plurality of power lead terminals 11 having power semiconductor elements 21 bonded thereto, those adjacent to each other with respect to the Y direction differ in length of base portion 11A. Power semiconductor element 21 bonded to one of power lead terminals 11 and power lead terminal 11 adjacent thereto are electrically connected through a wire 60 that is a fine line-shaped conductive member. This wire 60 corresponds to wire 60 extending from power semiconductor element 21 to the right side in FIG. 1.

On the Y-direction negative side in FIG. 6, three terminals to which power semiconductor element 21 is not bonded are spaced apart from each other and aligned. All of these terminals are aligned in the right-side region in the X direction in FIG. 6, in the same manner as power lead terminals 11 having power semiconductor elements 21 bonded thereto, and are electrically connected to power semiconductor elements 21 through wires 60. Here, these terminals therefore are considered as power lead terminals 11, similar to power lead terminals 11 having power semiconductor elements 21 bonded thereto.

Although integrated circuit elements 22 are bonded to only one integrated circuit lead terminal 12, a plurality of terminals are connected to integrated circuit elements 22 through wires 60. These wires 60 correspond to wire 60 extending from integrated circuit element 22 to the left side in FIG. 1. All of these terminals are aligned in the left-side region in the X direction in FIG. 6, in the same manner as integrated circuit lead terminal 12 having integrated circuit elements 22 bonded thereto, and are electrically connected to integrated circuit elements 22 through wires 60. Here, these terminals therefore are considered as integrated circuit terminals 12, similar to integrated circuit lead terminal 12 having integrated circuit elements 22 bonded thereto. In this point of view, specifically among a plurality of integrated circuit lead terminals 12 in a half region on the Y-direction positive side, those adjacent to each other with respect to the Y direction differ in length of base portion 12A.

Power semiconductor element 21 and integrated circuit element 22 are electrically connected by wire 60. This wire 60 corresponds to wire 60 connecting power semiconductor element 21 and integrated circuit element 22 in FIG. 1.

In FIG. 2, FIG. 5, and FIG. 6, there are two kinds of lengths of base portions 11A, 12A of lead terminals 11, 12. That is, a relatively long base portion and a relatively short base portion are alternately arranged. Relatively long base portions 11A, 12A all are of substantially the same length, and relatively short base portions 11A, 12A all are of substantially the same length. However, the present invention is not limited thereto, and there may be three or more kinds of lengths of base portions 11A, 12A. However, with fewer kinds of lengths of base portions 11A, 12A, for example, two kinds, an apparatus having a simple configuration can be used for bending lead terminals 11, 12. The manufacturing cost of the apparatus therefore can be reduced.

Referring to FIG. 7, shown here is a state in which external cooling member 70 shown in FIG. 1 is fixed to the section including lead member 10, semiconductor element 20, and mold resin 30 of power semiconductor device 1 ultimately mounted on circuit board 80. External cooling member 70 is here described as a member external to power semiconductor device 1 and not included in power semiconductor device 1, but may be included.

External cooling member 70 has, for example, a rectangular flat plate shape and has a pair of screw holes 71 in regions adjacent to one end and the other end of power semiconductor device 1 with respect to the Y direction. Circuit board 80 has a pair of screw holes 82 at positions two-dimensionally overlapping with the positions at which a pair of screw holes 71 are arranged when external cooling member 70 is overlaid. That is, screw hole 71 of external cooling member 70 and screw hole 82 of circuit board 80 have substantially the same size. In addition, screwing hole portions 32 that are a pair of semicircular cylindrical spaces are formed in regions adjacent to one end and the other end of mold resin 30 with respect to the Y direction. External cooling member 70 is overlaid with circuit board 80 such that the inner wall surfaces of screwing hole portions 32 are located substantially in contact with the wall surfaces of screw holes 71, 82. In this state, when screw holes 71 are two-dimensionally overlapped with screw holes 82 and screwing hole portions 32 are substantially in contact with screw holes 71, 82, fastening members 83 having male screws such as bolts are penetrated so as to penetrate screw holes 71 and screw holes 82. A part of power semiconductor device 1 including mold resin 30 is thus sandwiched between external cooling member 70 and circuit board 80 with respect to the Z direction. External cooling member 70 is a member that cools power semiconductor device 1 by releasing heat generated by power semiconductor element 21 to the outside of power semiconductor device 1.

For example, external cooling member 70 having a flat plate shape is installed in contact with the surfaces of die pad portion 11DP and mold resin 30, that is, the lowermost surface of mold resin 30 in FIG. 1.

The material and the like of the members (including external cooling member 70) of power semiconductor device 1 described above will now be described.

In FIG. 1, lead member 10, that is, power lead terminal 11 and integrated circuit lead terminal 12 are formed of a metal material, such as copper, processed into a flat plate shape. Conductive adhesive 51 for bonding power lead terminal 11 and power semiconductor element 21 and conductive adhesive 52 for bonding integrated circuit lead terminal 12 and integrated circuit element 22 are preferably formed of solder or silver paste. Hereinafter, conductive adhesive 51 and conductive adhesive 52 are collectively considered as conductive adhesive 50. Wire 60 electrically connecting the members is formed of a metal material such as gold or silver. Lead member 10, semiconductor element 20, conductive adhesive 50, and wire 60 are connected to each other to form an electrical circuit. The materials of wires 60 at the sections shown in FIG. 1 and FIG. 6 and the diameters of their circular shapes in cross section may be the same or may be different.

Mold resin 30 sealing the electrical circuit above is preferably formed of a thermosetting resin such as epoxy resin. Coating resin 40 covering a part of the surface of mold resin 30 is also preferably a thermosetting resin.

The material of coating resin 40 may be the same as or may be different from the material of mold resin 30. When coating resin 40 is of the same material as and of similar components to mold resin 30, their coefficients of linear thermal expansion are substantially the same. Thus, the adhesion between coating resin 40 and mold resin 30 is excellent, and the insulation of a member having them in combination is improved. Even when their materials are the same, they can be distinguished from each other by cross-section observation. This is because there is an interface at the boundary between mold resin 30 and coating resin 40 on its surface.

For example, even when mold resin 30 is epoxy resin and coating resin 40 is a material different from mold resin 30, such as polyimide resin, power semiconductor device 1 having high reliability can be obtained. This is because polyimide resin has a high heat resistance compared with inexpensive epoxy resin.

As described later, in a manufacturing process of power semiconductor device 1, after mold resin 30 is formed, a thin film of coating resin 40 is formed. Thus, more preferably, the material of coating resin 40 formed subsequently is completely cured at a temperature lower than the material of mold resin 30 formed previously. If the curing temperature of the resin material of coating resin 40 exceeds the curing temperature of the resin material of mold resin 30, mold resin 30 may be degraded when coating resin 40 is completely cured. It is therefore preferable that coating resin 40 is formed of epoxy resin or polyimide resin that is completely cured at about 180° C.

External cooling member 70 is preferably formed of a metal material, such as aluminum, excellent in heat dissipation. Although not shown, heat dissipation grease may be sandwiched between external cooling member 70 and coating resin 40. By doing so, the adhesion between external cooling member 70 and coating resin 40 in contact therewith is improved.

A method of manufacturing power semiconductor device 1 in the present embodiment will now be described with reference to FIG. 8 to FIG. 11.

Figure 8:
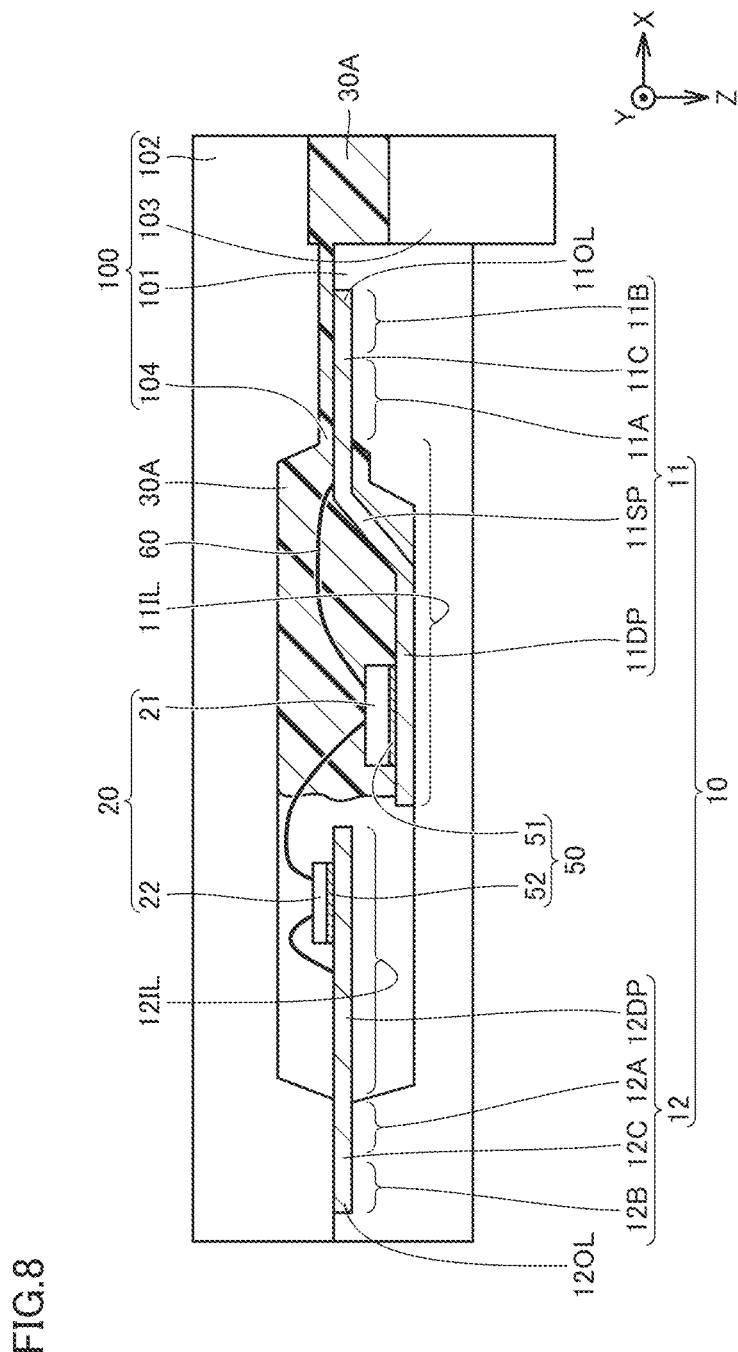
FIG. 8 is a schematic cross-sectional view showing a first step of a method of manufacturing a power semiconductor device according to the first embodiment.

FIG. 8 is a schematic cross-sectional view showing a first step of the method of manufacturing a power semiconductor device according to the first embodiment. Referring to FIG. 8, first, power lead terminals 11 and integrated circuit lead terminals 12 as lead member 10 are prepared. Specifically, a metal material such as copper processed into a flat plate shape is prepared. Subsequently, the metal material is processed into the shape of lead terminals 11, 12 by etching or blanking. That is, die pad portions 11DP, 12DP, base portions 11A, 12A, and tip end portions 11B, 12B are formed. Then, step portion 11SP is formed by bending using a bending tool. At this point of time, the whole of lead terminals 11 and lead terminals 12 may be surrounded on the outside like a frame, whereby the whole of lead terminals 11 and lead terminals 12 is formed as an integrated lead frame.

Then, power semiconductor element 21 is bonded to and placed on one surface of die pad portion 11DP using conductive adhesive 51. Integrated circuit element 22 is bonded to and placed on one surface of die pad portion 12DP using conductive adhesive 52. Then, as shown in FIG. 6, lead terminals 11, 12 and semiconductor element 20 are connected by wires 60. Power semiconductor element 21 and integrated circuit element 22 are connected by wire 60.

Then, in a state in which semiconductor element 20 is placed on lead member 10 as described above, semiconductor element 20 is sealed with resin. Specifically, lead member 10 (lead frame) on which semiconductor element 20 is placed is installed in a molding device 100, as shown in FIG.

8. Molding device 100 is a device for sealing semiconductor element 20 and the like with a resin material by a transfer molding process.

Molding device 100 includes a lower mold 101, an upper mold 102, a plunger 103, and a resin injection port 104. Lower mold 101 is a part of a mold that is arranged on the lower side in FIG. 8 (the Z-direction positive side), and upper mold 102 is a part of the mold that is arranged on the upper side in FIG. 8 (Z-direction negative side). A region sandwiched between lower mold 101 and upper mold 102 is a region in which semiconductor element 20 and the like to be sealed is arranged, and in which resin is supplied to form a mold resin. Lead terminals 11, 12 are therefore installed such that a region to be exposed from the mold resin, for example, a region formed as an outer lead, is arranged outside the region sandwiched between lower mold 101 and upper mold 102.

Molding device 100 has plunger 103 outside the region in which the mold resin is to be formed. Plunger 103 is a member for installing a tablet resin 30A as a material for forming the mold resin. Molding device 100 also has resin injection port 104 in the vicinity of the region in which the mold resin is to be formed. Tablet resin 30A is injected from resin injection port 104 into the region in which the mold resin is to be formed.

Tablet resin 30A having a shape and formed of epoxy resin or the like is mounted on plunger 103. Lead member 10 (lead frame) including a portion bonded to semiconductor element 20 is clamped by lower mold 101 and upper mold 102. In clamping, it is preferable that the lowermost surface of a portion filled with resin in lower mold 101 is installed in contact with die pad portion 11DP. By doing so, during releasing after the molding step, the surface of die pad portion 11DP on the opposite side to the side on which power semiconductor element 21 is bonded can be exposed from the mold resin.

Subsequently, plunger 103 is pushed upward (Z-direction negative side) in FIG. 8. Tablet resin 30A is then injected through resin injection port 104 into a space in which semiconductor element 20 is arranged. Tablet resin 30A has a shape but is easily deformed to be flowable.

The injected tablet resin 30A is flowable and fills the space in which semiconductor element 20 is arranged. Subsequently, lower mold 101 and upper mold 102 are heated to perform an after-curing step. Tablet resin 30A is then completely cured into solid mold resin 30 to seal semiconductor element 20 and the like. Subsequently, a thin film of tin or the like may be formed by plating on a portion of power lead terminal 11 and integrated circuit lead terminal 12 exposed on the outside of mold resin 30, that is, on the surface of the outer lead.

Figure 9:
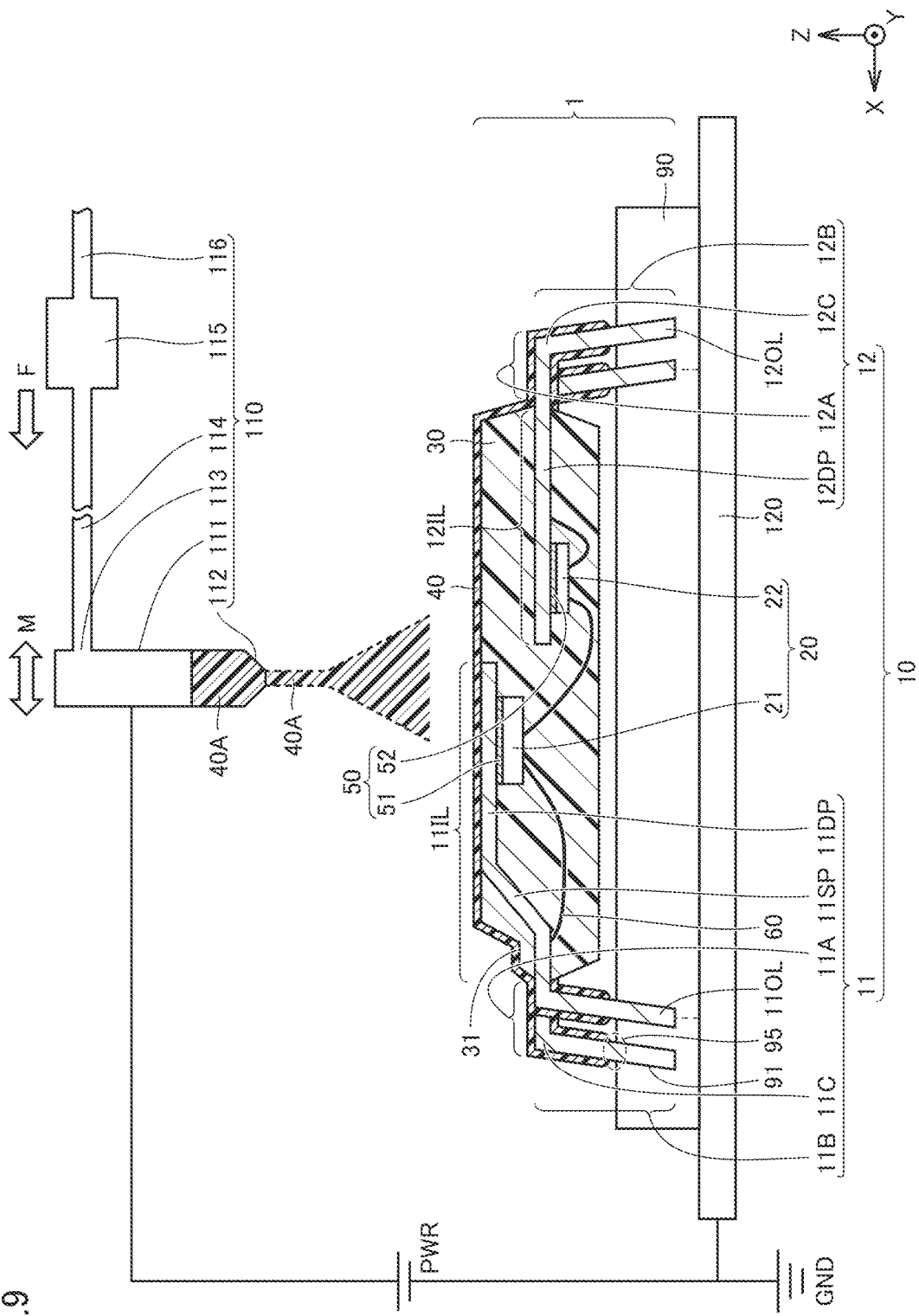
FIG. 9 is a schematic cross-sectional view showing a second step of the method of manufacturing a power semiconductor device according to the first embodiment.

FIG. 9 is a schematic cross-sectional view showing a second step of the method of manufacturing a power semiconductor device according to the first embodiment. Referring to FIG. 9, first, the solidified mold resin 30 is removed from molding device 100. At this point of time, the lead frame is arranged such that a region to be formed as the outer lead is arranged outside the region sandwiched between lower mold 101 and upper mold 102 described above. The lead frame is cut out so that power lead terminal 11 and integrated circuit lead terminal 12 are separately cut as a plurality of lead terminals. That is, lead member 10 includes a plurality of lead terminals 11, 12 separately cut, and a plurality of lead terminals 11, 12 extend from the inside to the outside of mold resin 30 formed of resin (tablet resin 30A) and include inner lead portions 11IL, 12IL and outer lead portions 11OL, 12OL.

Power lead terminal 11 is bent at turn portion 11C. Outer lead portion 11OL is thus divided into base portion 11A and tip end portion 11B. Integrated circuit lead terminal 12 is bent at turn portion 12C. Outer lead portion 12OL is thus divided into base portion 12A and tip end portion 12B. That is, lead terminals 11, 12 divided into a plurality of pieces by cutting out the lead frame include base portions 11A, 12A and tip end portions 11B, 12B on the outside of mold resin 30. Base portions 11A, 12A are arranged on the side closer to the region having power semiconductor element 21 and integrated circuit element 22 with respect to their extending directions. Base portions 11A, 12A extend in the direction protruding from mold resin 30, that is, in the X direction or the Y direction along the XY plane. On the other hand, tip end portions 11B, 12B are arranged on the opposite side of the base portion 11A, 12A from turn portion 11C, 12C, relative to the region in which power semiconductor element 21 and integrated circuit element 22 are placed, that is, on the side far from the region in which semiconductor element 20 is placed. In other words, tip end portions 11B, 12B extend in a direction different from base portions 11A, 12A and are arranged on the opposite side to the region in which power semiconductor element 21 and integrated circuit element 22 are placed, as viewed from base portions 11A, 12A, that is, on the side far from the region in which semiconductor element 20 is placed.

The lengths by which base portions 11A, 12A extend in the present embodiment differ between a pair of power lead terminals 11 or integrated circuit lead terminals 12 adjacent to each other, among a plurality of power lead terminals 11 and integrated circuit lead terminals 12, as described above.

Subsequently, coating resin 40 is formed, for example, at a part of the member including semiconductor element 20 sealed with resin that is mold resin 30, that is, the member ultimately serving as power semiconductor device 1. Specifically, in a state turned upside down compared with the transfer molding step in FIG. 8, for example, a part of the member serving as power semiconductor device 1 is installed on conductive member 90. In this state, a resin material to form coating resin 40 is supplied by an electrostatic spray mechanism 110 from above in FIG. 9, that is, from the Z-direction positive side, onto the surface of mold resin 30.

For example, conductive member 90 is installed on a stage 120 having a rectangular flat plate shape. Stage 120 is formed of a conductive material and is connected to ground GND to be grounded. Conductive member 90 has, for example, a rectangular flat plate shape. Conductive member 90 is formed of a material having a hardness lower than that of copper forming lead member 10. That is, conductive member 90 is formed of, for example, conductive rubber. Specifically, the surfaces of at least partial regions on the end side of tip end portion 11B of power lead terminal 11 and integrated circuit lead terminal 12 turned upside down and oriented downward in FIG. 9 are embedded in conductive member 90. This ensures that coating resin 40 is not formed at a region serving as exposed portion 14. For this, at least a part (on the tip end side) of tip end portion 11B of power lead terminal 11 and tip end portion 12B of integrated circuit lead terminal 12 are inserted into, for example, grooves 91 extending from the uppermost surface to the inside of conductive member 90.

It is preferable that, in tip end portions 11B, 12B, boundary portion 95 between a region serving as covering portion 13 and a region serving as exposed portion 14 is covered with the body of conductive member 90 with substantially no space, such that coating resin 40 is not deposited on at least parts (tip end side) of tip end portion 11B of power lead terminal 11 and tip end portion 12B of integrated circuit lead terminal 12.

It is preferable that stage 120, conductive member 90, power lead terminal 11, and integrated circuit lead terminal 12 are grounded substantially at the same potential. This is to form a uniform coating resin 40 efficiently using an electrostatic spraying process described later. However, the region serving as exposed portion 14 of power lead terminal 11 and integrated circuit lead terminal 12 need not be entirely in intimate contact with conductive member 90. At least only a part of the region serving as exposed portion 14 is in contact with conductive member 90.

Electrostatic spray mechanism 110 includes a nozzle 111 having a nozzle opening 112, a compressed air inlet 113, a pipe 114, a pressure regulating mechanism 115, and a compressed air supply port 116. Nozzle 111 is a hollow member and connected to a high-voltage power supply PWR. Thus, a high voltage relative to ground GND can be applied to nozzle 111. Nozzle 111 has nozzle opening 112 as an opening at its lowermost portion. Compressed air inlet 113 is formed at a part of the inner wall surface of nozzle 111 such that the inner wall surface has an opening. This compressed air inlet 113 is connected to pipe 114. Pipe 114 is hollow. Thus, the interior space of nozzle 111 and the hollow portion of pipe 114 are continuous through compressed air inlet 113. Pressure regulating mechanism 115 and compressed air supply port 116 connected to pipe 114 are also hollow members and continuous to the hollow portion of pipe 114. Thus, compressed air supply port 116, pressure regulating mechanism 115, pipe 114, and nozzle 111 are continuous such that the device interior space of electrostatic spray mechanism 110 is integrated.

A charged resin material diffused into a spray adheres to the surface of at least a part of the member ultimately serving as power semiconductor device 1, by an electrostatic spraying process using electrostatic spray mechanism 110 as described above. Here, specifically, the charged resin material diffused into a spray is supplied to the surface of base portion 11A. Thus, the charged resin material diffused into a spray, for example, adheres to the surface of base portion 11A. In this way, the charged resin material diffused into a spray is formed on the surface of base portion 11A. Specifically, the process is based on the method below. A liquid or powder resin material 40A that is a material to be formed as coating resin 40 is supplied to the inside of nozzle 111 made of metal. In this state, compressed air is supplied into compressed air supply port 116. The pressure regulated by pressure regulating mechanism 115 is added to the compressed air in compressed air supply port 116. The compressed air then flows from compressed air supply port 116 toward pressure regulating mechanism 115 and pipe 114. The compressed air further flows from the inside of pipe 114 through compressed air inlet 113 and flows into nozzle 111. The pressure of the compressed air is regulated by control by pressure regulating mechanism 115.

The compressed air flowing into nozzle 111 pushes the liquid or powder resin material 40A in nozzle 111 so that resin material 40A is released from nozzle opening 112. At this point of time, high-voltage power supply PWR applies a high voltage of 2 kV or more and 5 kV or less to nozzle 111. With this high voltage, resin material 40A is charged and diffused in a spray from nozzle opening 112. The pressure of the compressed air is regulated by pressure regulating mechanism 115, whereby the jetting speed of resin material 40A diffused from nozzle opening 112 is controlled. To suppress dripping of resin material 40A from nozzle opening 112, it is preferable that the opening portion of the nozzle opening 112 is substantially circular in a two-dimensional view and has a diameter of 1 mm or less.

The diffused resin material 40A is deposited on the surface of the member arranged below in the Z direction. Specifically, a spray of resin material 40A charged to a high voltage is deposited on the surface of mold resin 30 in FIG. 9, the surface of die pad portion 11DP on the opposite side to the surface on which power semiconductor element 21 is placed, and a part of the surfaces of base portions 11A, 12A and tip end portions 11B, 12B of lead terminals 11, 12. Thus, this resin material 40A is formed as a uniform thin film-like coating resin 40. Accordingly, the surfaces of at least respective base portions 11A, 12A of a plurality of lead terminals 11, 12 are covered with coating resin 40 in the step of forming coating resin 40. The method of forming coating resin 40 by jetting a spray of resin material 40A as described above is called electrostatic spraying process.

In order to supply a spray of resin material 40A uniformly to each region described above, as shown by the arrows M in FIG. 9, it is preferable that nozzle 111 is movable relative to the member serving as power semiconductor device 1 set on conductive member 90. That is, nozzle 111 can be moved by a not-shown drive mechanism in the X direction, the Y direction, and the Z direction.

Figure 10:
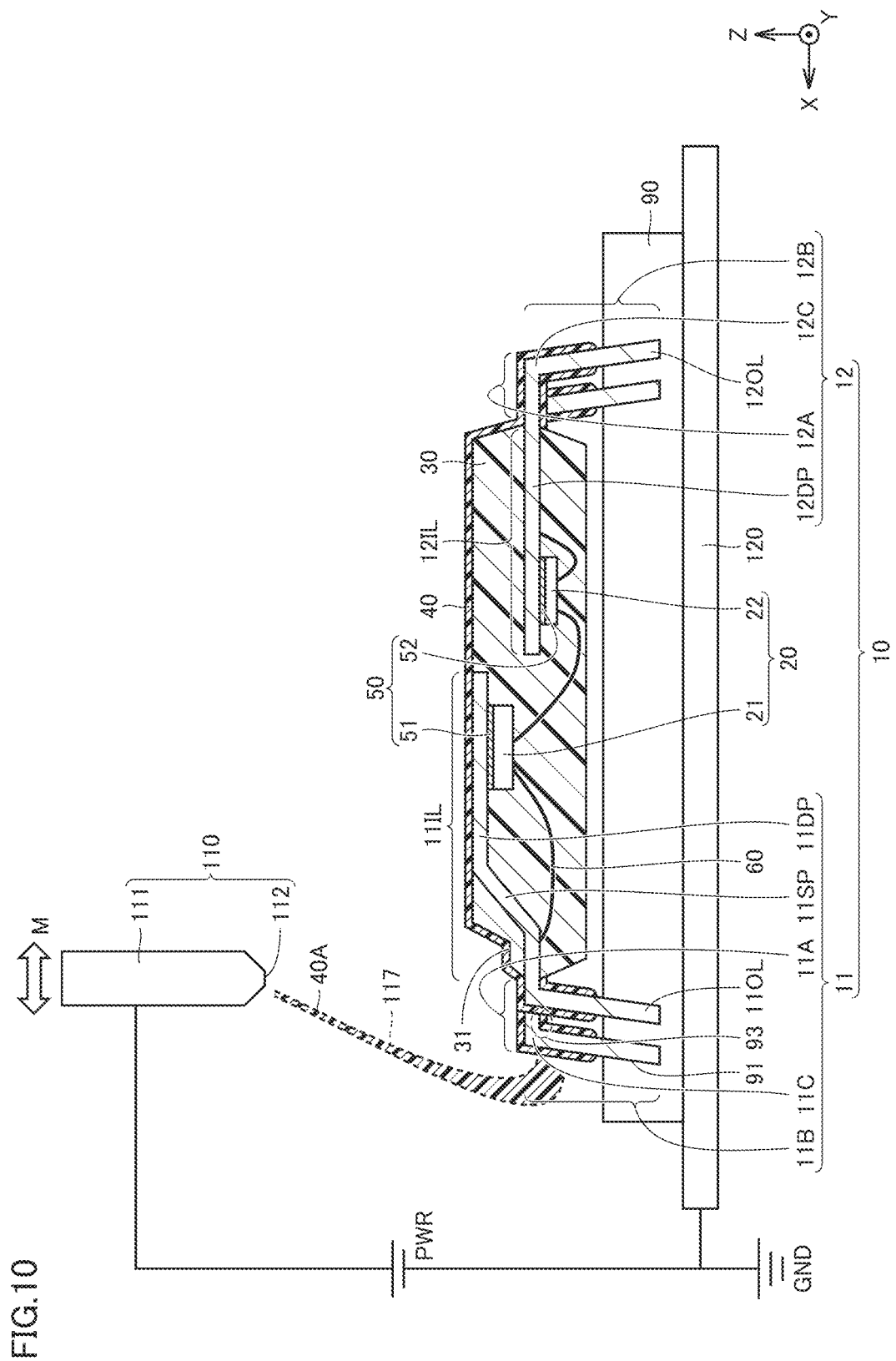
FIG. 10 is a schematic cross-sectional view showing a third step of the method of manufacturing a power semiconductor device according to the first embodiment.

FIG. 10 is a schematic cross-sectional view showing a third step of the method of manufacturing a power semiconductor device according to the first embodiment. Referring to FIG. 10, the high voltage applied to nozzle 111 of electrostatic spray mechanism 110 causes an electric line of force 117 from nozzle 111 toward ground GND. Electric line of force 117 extends so as to be curved from nozzle opening 112 to a blind spot 93 on the opposite side to the upper surface in FIG. 10 facing nozzle opening 112. Resin material 40A emitted from nozzle opening 112 advances along the electric line of force 117 to be deposited not only on the surface facing upward in FIG. 10 but also on a region oriented downward in FIG. 10 and surrounded by other members, such as blind spot 93. Therefore, nozzle 111 is moved, for example, in the X direction so that the spray of resin material 40A along electric line of force 117 can come around to be deposited on blind spot 93. The electrostatic spraying process therefore can be used to increase a region on which coating resin 40 can be deposited, compared with when the electrostatic spraying process is not used. The electrostatic spraying process therefore can improve the insulation of the entire power semiconductor device 1 (see FIG. 1) to be formed, compared with when the electrostatic spraying process is not used. For example, coating resin 40 can be formed over the entire surface of base portions 11A, 12A of lead terminals 11, 12.

After coating resin 40 is formed on the surfaces of mold resin 30, die pad portion 11DP, and lead terminals 11, 12 by the electrostatic spraying process described above, coating resin 40 formed is heated to about 180° C. in a curing step. Coating resin 40 is then completely cured.

In the present embodiment, after semiconductor element 20 is sealed with resin, coating resin 40 may be formed on the member including semiconductor element 20 sealed with the resin. Alternatively, in the present embodiment, for example, semiconductor element 20 sealed with resin may be purchased from outside, and coating resin 40 may be formed on the member including semiconductor element 20.

Figure 11:
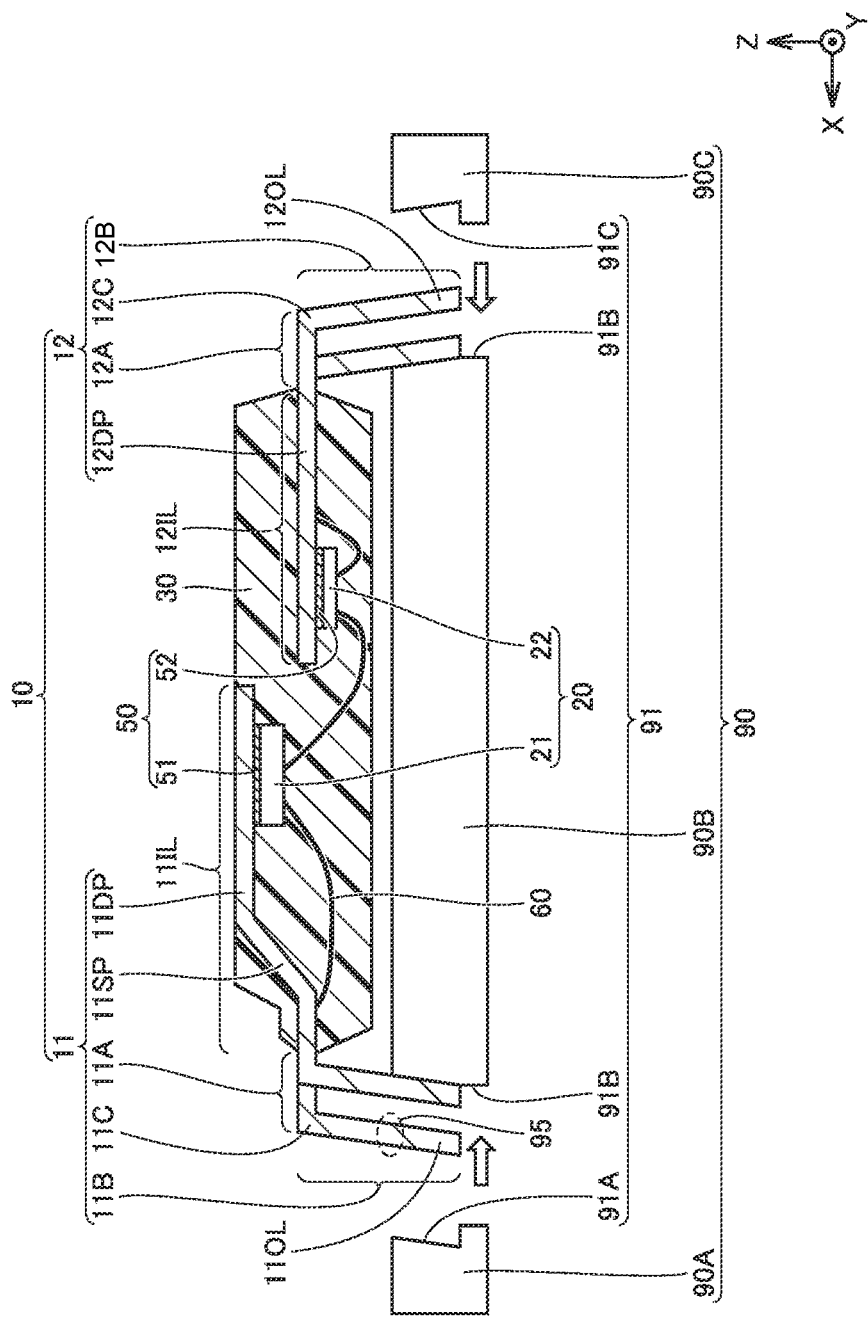
FIG. 11 is a schematic cross-sectional view showing a modification to a configuration of a conductive member used in a step of an electrostatic spraying process.
Figure 12:
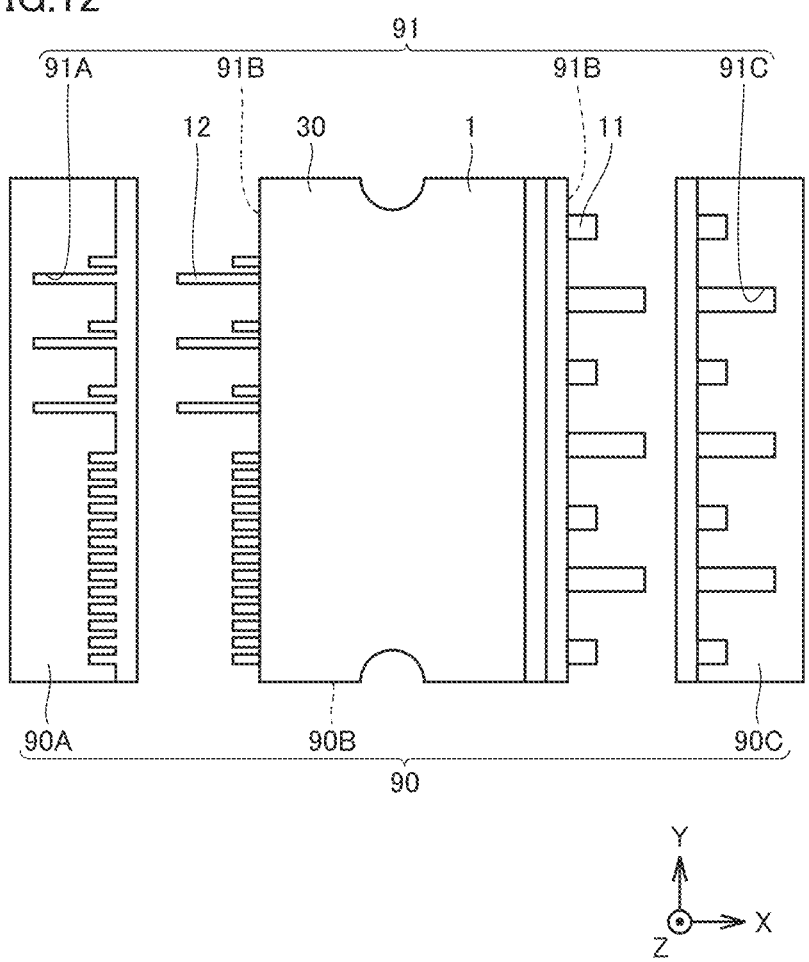
FIG. 12 is a schematic plan view showing a modification to the configuration of the conductive member in FIG. 11.

FIG. 11 is a schematic cross-sectional view showing a modification to the configuration of the conductive member used in the step of electrostatic spraying. FIG. 12 is a schematic plan view showing a modification to the configuration of the conductive member in FIG. 11. For convenience of explanation, FIG. 12 illustrates a part of power semiconductor device 1 similar to that in FIG. 5. In FIG. 9 and FIG. 10, tip end portions 11B, 12B of the outer lead are inserted into the grooves 91 in which conductive member 90 is partially removed from the uppermost surface to the inside. By contrast, referring to FIG. 11 and FIG. 12, conductive member 90 in this modification includes three parts: a first conductive member 90A, a second conductive member 90B, and a third conductive member 90C. Conductive member 90 is configured as an assembly of these three parts.

Second conductive member 90B is a member at the center in a two-dimensional view of conductive member 90 in FIG. 11 and FIG. 12 and located at the center in the X direction. A part of the member (denoted by reference numeral 1 in FIG. 12) ultimately serving as power semiconductor device 1 and to be provided with coating resin 40 is placed on second conductive member 90B. In the plan view of FIG. 12, therefore, second conductive member 90B is hidden under the member serving as the power semiconductor device 1.

First conductive member 90A is a member to hold tip end portions 11B, 12B of the outer lead installed on second conductive member 90B, from the left side in the drawing. Third conductive member 90C is a member to hold tip end portions 11B, 12B of the outer lead installed on second conductive member 90B, from the right side in the drawing.

The surfaces of tip end portions 11B, 12B of the outer lead of the member serving as a power semiconductor device are partially in contact with a second groove 91B formed as an end surface in the X direction of second conductive member 90B. On the other hand, second conductive member 90B is sandwiched between first conductive member 90A and third conductive member 90C from the outside in the X direction. First conductive member 90A and third conductive member 90C can be moved closer to or away from second conductive member 90B with respect to the X direction.

First conductive member 90A and third conductive member 90C come closer to second conductive member 90B. Then, tip end portion 11B of the member serving as a power semiconductor device installed on second conductive member 90B comes into contact with a first groove 91A formed as an end surface in the X direction of first conductive member 90A and with the above-noted second groove 91B. That is, first groove 91A and second groove 91B are connected together to form a single groove having a configuration similar to groove 91 in FIG. 9. Tip end portion 11B is inserted into groove 91 formed with first groove 91A and second groove 91B. In addition, tip end portion 12B of the member serving as a power semiconductor device installed on second conductive member 90B comes into contact with a third groove 91C formed as an end surface in the X direction of third conductive member 90C and with the above-noted second groove 91B. That is, third groove 91C and second groove 91B are connected together to form a single groove having a configuration similar to groove 91 in FIG. 9. Tip end portion 12B is inserted into groove 91 formed with third groove 91C and second groove 91B.

In other words, first groove 91A formed in first conductive member 90A and third groove 91C formed in third conductive member 90C come into contact, from the outside in the X direction, with tip end portions 11B, 12B in contact with second groove 91B. As described above, even when conductive member 90 having a configuration as an assembly of three parts is used, the function is similar to when conductive member 90 having a configuration as a single unit is used as shown in FIG. 9 and FIG. 10.

The operation effects of the present embodiment will now be described.

In power semiconductor device 1 in the present embodiment, the lengths by which base portions 11A, 12A of a plurality of lead terminals 11, 12 extend are different between a pair of lead terminals 11, 12 adjacent to each other. That is, the tip end portions of lead terminals 11, 12 and through holes 81 of circuit board 80 to receive them have a staggered arrangement in a two-dimensional view. Therefore, for example, compared with when all of the lengths of base portions 11A, 12A are substantially equal, the distance between adjacent lead terminals 11, 12 and the distance D1 (see FIG. 5) between adjacent through holes 81 can be increased. In the step of forming a coating resin, resin material 40A (see FIG. 9) adheres to at least the surfaces of base portions 11A, 12A of lead terminals 11, 12, and at least the surfaces of base portions 11A, 12A are covered with coating resin 40. Because of this, the distance W1 (see FIG. 5) between a pair of lead terminals 11, 12 can be reduced. In the present embodiment, because of their synergistic effect, even when the distance W1 is reduced, the distance D1 can be increased, and the electrical insulation between adjacent lead terminals can be ensured by coating resin 40. Short-circuiting between adjacent lead terminals therefore can be suppressed enough even with the distance W1 reduced, and consequently, power semiconductor device 1 can be miniaturized.

Figure 13:
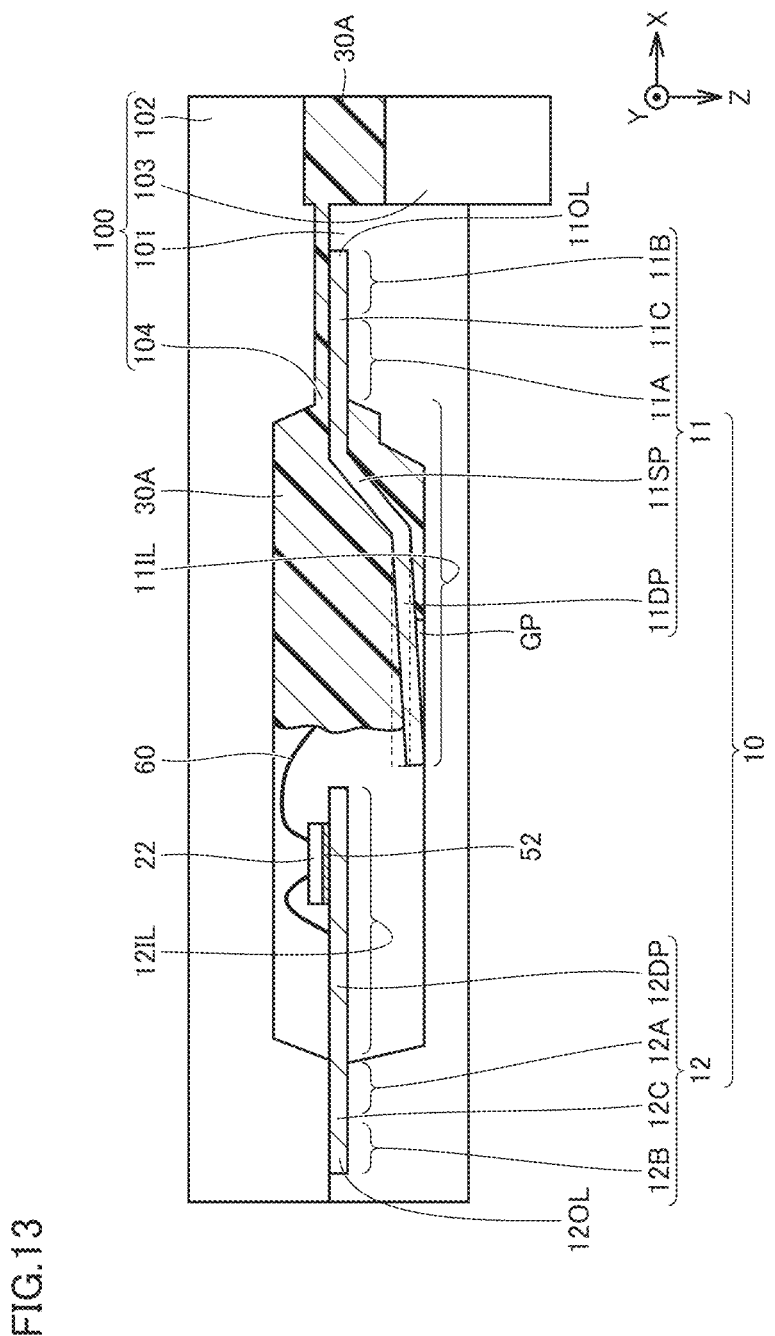
FIG. 13 is a schematic cross-sectional view showing a first step of a method of manufacturing a power semiconductor device as a comparative example of the first embodiment.

FIG. 13 is a schematic cross-sectional view showing a first step of a method of manufacturing a power semiconductor device as a comparative example of the first embodiment. Referring to FIG. 13, the transfer molding step in this comparative example is basically similar to the transfer molding step in the first embodiment in FIG. 8. In FIG. 13, therefore, the same constituent elements as those in FIG. 8 are denoted by the same reference signs and will not be further elaborated. However, in the method of manufacturing a power semiconductor device in the comparative example in FIG. 13, only mold resin 30 is formed and coating resin 40 thereon is not formed. In this case, the method is performed as follows for sealing the entire surface of die pad portion 11DP in FIG. 13 finally in the inside of mold resin 30. In clamping, die pad portion 11DP is installed such that a gap GP is ensured between die pad portion 11DP and the lowermost surface of the portion filled with resin in lower mold 101. In general, the gap GP is about 350 µm, but it is preferable that gap GP is 100 µm or less in order to ensure high heat dissipation from die pad portion 11DP to the outside of mold resin 30. In particular, when gap GP is 50 µm or more and 70 µm or less, the insulation between die pad portion 11DP and the outside of mold resin 30 can be ensured while heat dissipation from die pad portion 11DP to mold resin 30 can be improved.

However, in this manner, as tablet resin 30A moves in the transfer molding step, die pad portion 11DP flows. Specifically, in the typical transfer molding step, if gap GP is adjusted to about 100 µm or less, the flowable tablet resin 30A comes under die pad portion 11DP when injected into the space in which semiconductor element 20 is arranged. The tablet resin 30A coming around in this way causes die pad portion 11DP to move and become inclined relative to the horizontal direction. Die pad portion 11DP is thus inclined relative to the bottom surface of lower mold 101. Then, as shown in FIG. 13, the thickness of tablet resin 30A coming under die pad portion 11DP becomes uneven. This reduces the reliability of sealing of die pad portion 11DP with mold resin 30. If the gap GP is reduced in this way, keeping the gap GP substantially uniform as a whole is often difficult.

By comparison, in the present embodiment, coating resin 40 is formed in addition to mold resin 30. Thus, as shown in FIG. 8, die pad portion 11DP is brought into contact with the inner bottom surface of lower mold 101, and the back surface of die pad portion 11DP is exposed from mold resin 30, whereby coating resin 40 can be deposited uniformly on the back surface. For example, the film can be deposited uniformly such that coating resin 40 has a thickness of 50 µm or more and 70 µm or less. This ensures heat insulation between die pad portion 11DP and external cooling member 70 arranged immediately below and, at the same time, can stabilize the cooling performance from die pad portion 11DP to external cooling member 70.

Figure 14:
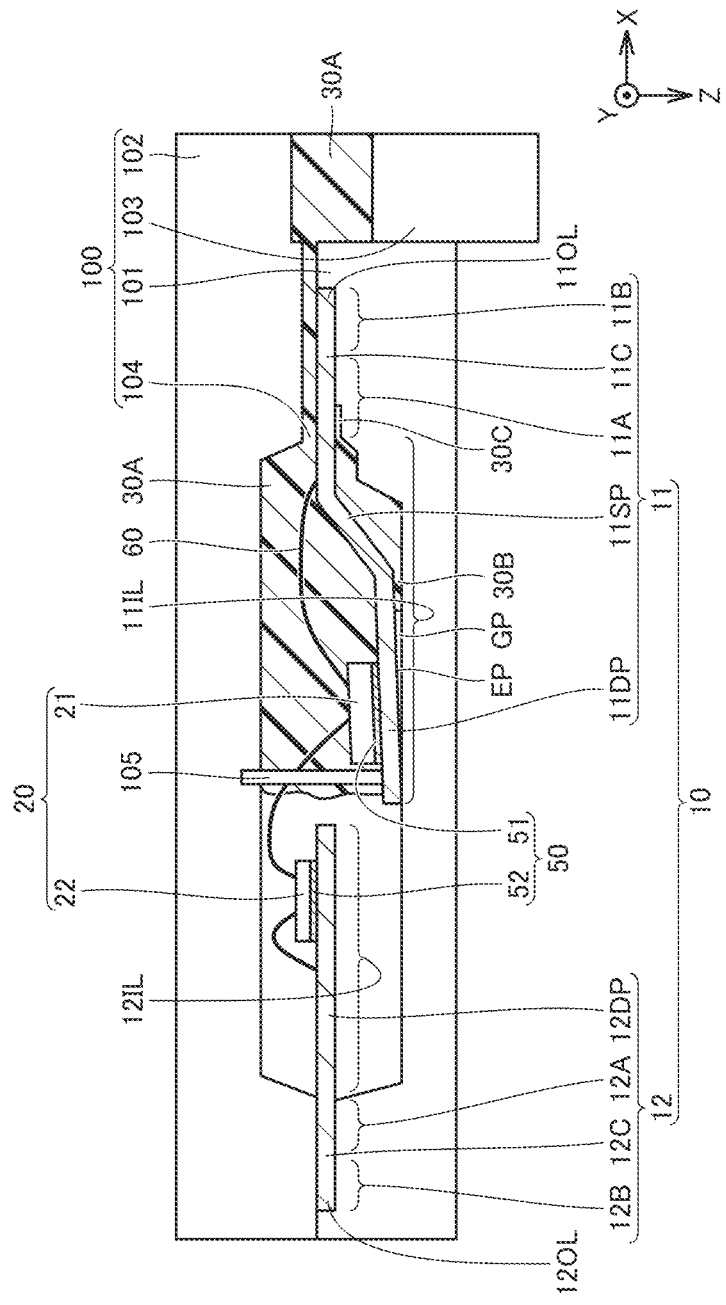
FIG. 14 is a schematic cross-sectional view showing a first step of the method of manufacturing a power semiconductor device as a modification of the first embodiment.

FIG. 14 is a schematic cross-sectional view showing a first step of the method of manufacturing a power semiconductor device as a modification of the first embodiment. Referring to FIG. 14, the transfer molding step in this modification is generally similar to the transfer molding step in the comparative example in FIG. 13, and the same constituent elements are denoted by the same reference signs and will not be further elaborated. However, in the step in FIG. 14, mold resin 30A leaks to the surface of die pad 11DP or base portion 11A. Technique of providing a movable pin 105 to prevent deformation of die pad 11DP in a transfer molding step is commonly known. However, it is still difficult to suppress leakage of resin by applying a large load on die pad 11DP. As a result, in FIG. 14, for example, after mold resin 30A is released from lower mold 101, mold resin 30A may be partially left as a resin burr 30B and a resin burr 30C. In this case, for example, resin buff 30B pushes die pad 11DP upward. Then, an exposed portion EP may be formed on the lowermost surface of die pad 11DP at the gap GP between the lowermost surface of die pad 11DP and the inner wall surface of the space in which semiconductor element 20 is arranged in lower mold 101. Exposed portion EP is a region in which mold resin 30A is not arranged under die pad 11DP. If exposed portion EP remains as it is, the reliability of sealing of die pad portion 11DP with mold resin 30 may be reduced.

Figure 15:
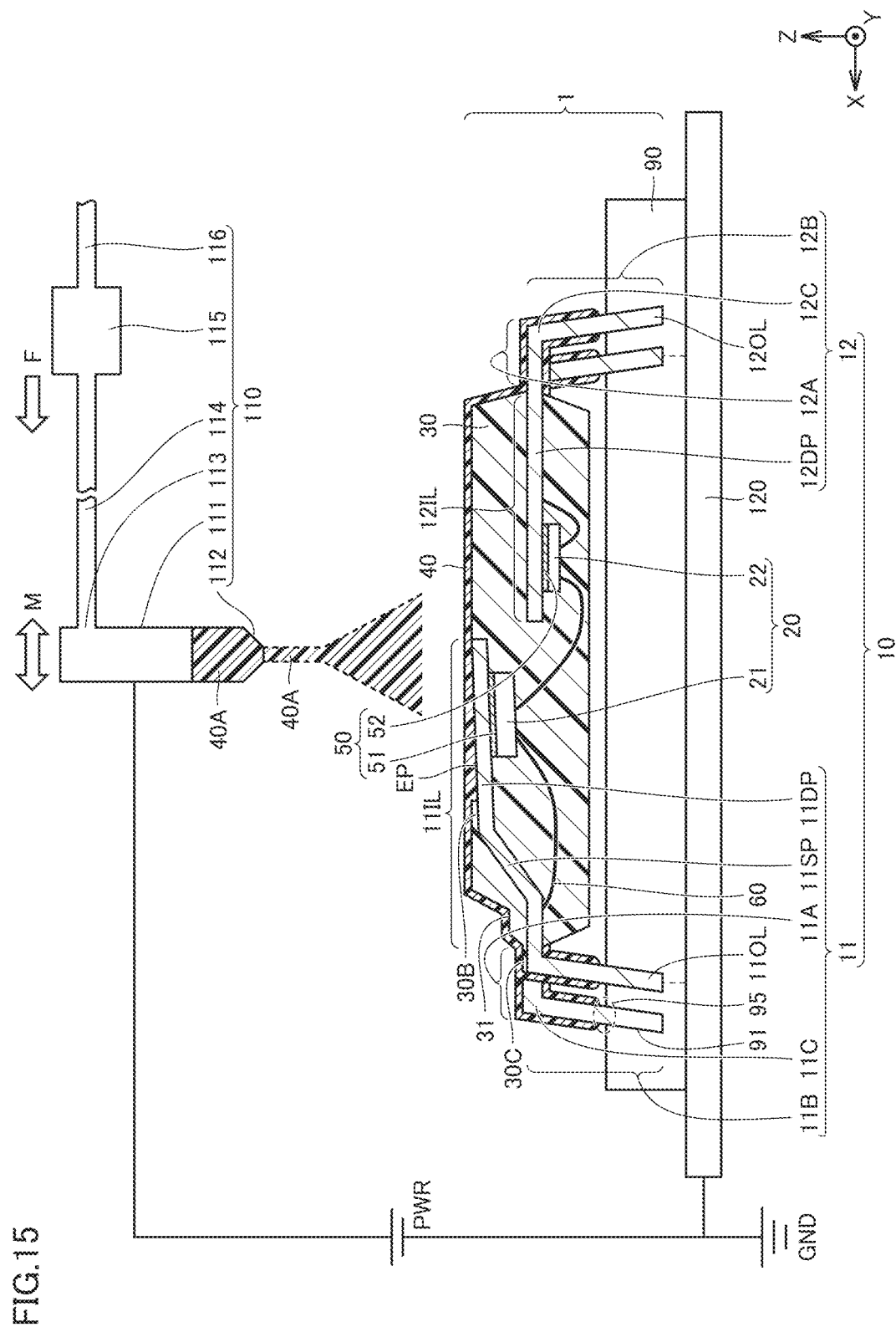
FIG. 15 is a schematic cross-sectional view showing a second step of the method of manufacturing a power semiconductor device as a modification of the first embodiment.

FIG. 15 is a schematic cross-sectional view showing a second step of the method of manufacturing a power semiconductor device as a modification of the first embodiment. Referring to FIG. 15, this step is similar to formation of coating resin 40 by the electrostatic spraying process in the first embodiment in FIG. 9. In FIG. 15, each of a plurality of lead terminals 11 has die pad portion 11DP on which power semiconductor element 21 is placed, and each of a plurality of lead terminals 12 has die pad portion 12DP on which integrated circuit element 22 is placed. In the step of forming coating resin 40 in FIG. 15, die pad portions 11DP, 12DP are grounded.

That is, outer lead portions 11OL, 12OL continuous to die pads 11DP, 12DP as well as conductive member 90 and conductive stage 120 all are brought to substantially the same potential that is ground potential by ground GND. Then, as shown in FIG. 15, resin material 40A selectively adsorbs on the surface of the grounded die pad 11DP. Coating resin 40 is thus formed on exposed portion EP. Since exposed portion EP is covered with coating resin 40, coating resin 40 flows and covers even the surface having protrusions and depressions formed by resin burrs 30B, 30C. The surface having protrusions and depressions formed by resin burrs 30B, 30C is thus planarized. Coating resin 40 covers to planarize a surface above die pads 11DP, 12DP in FIG. 15. As a result, heat dissipation from die pads 11DP, 12DP to the outside of mold resin 30 and insulation between die pads 11DP, 12DP and the outside of mold resin 30 are excellent.

Coating resin 40 is formed so as to be continuous from the surface of base portion 11A to the lower surface in FIG. 1 of die pad portion 11DP of a plurality of lead terminals 11, that is, the surface on the opposite side to the surface on which semiconductor element 20 is placed. However, in the present embodiment, coating resin 40 may be formed at least partially from the surface of base portion 11A to the lower surface in FIG. 1 of die pad portion 11DP. This ensures minimum insulation in the region between die pad 11DP and the outside of mold resin 30. In particular, it is preferable that coating resin 40 is formed at die pad portion 11DP, and coating resin 40 at die pad portion 11DP is formed on the lower surface in FIG. 1 on the opposite side to the surface on which semiconductor element 20 is placed. In this way, as described above, coating resin 40 is formed as an insulating layer having a uniform thickness on the lower surface of die pad portion 11DP. Thus, heat dissipation from semiconductor element 20 mounted on die pad portion 11DP to the outside of mold resin 30 is performed smoothly by coating resin 40. This coating resin 40 therefore can increase heat dissipation from semiconductor element 20. This coating resin 40 also can enhance insulation between semiconductor element 20 and the outside of mold resin 30.

Furthermore, as shown in FIG. 1, it is preferable that coating resin 40 at die pad portion 11DP is formed only on the lower surface in FIG. 1 of die pad portion 11DP. In this way, the region of coating resin 40 is limited to the minimum required region, and consequently, resin material 40A can be reduced and the manufacturing cost can be reduced.

Next, in the present embodiment, mold resin 30 has holes to allow lead terminals 11, 12 to pass through, at portions in which lead terminals 11, 12 protrude from the inside. The holes create small gaps between mold resin 30 and lead terminals 11, 12 protruding therefrom. The gaps are closed by coating resin 40 covering continuously from the surface of base portion 11A to the surface of die pad portion 11DP. This suppresses intrusion of moisture from the gaps to the inside of mold resin 30. Size change due to degradation and expansion of mold resin 30 is also suppressed. Accordingly, the reliability of power semiconductor device 1 is improved.

Furthermore, in the present embodiment, at least a part of the gaps between mold resin 30 and lead terminals 11, 12 protruding therefrom is filled with coating resin 40. Thus, compared with when coating resin 40 is not formed, the adhesion strength between mold resin 30 and lead terminals 11, 12 is improved. This improves the reliability of power semiconductor device 1 against vibration stress applied to lead terminals 11, 12 in the mounting step.

As described above, in the present embodiment, mold resin step portion 31 is formed at the outer surface of mold resin 30. In this case, compared with when mold resin step portion 31 is not provided, the strength of the package of power semiconductor device 1 with mold resin 30 is weak, and mold resin 30 may be easily broken from screwing hole portions 32 due to fastening members 83 (see FIG. 5) penetrating screw holes 71, 82. However, in the present embodiment, coating resin 40 is formed so as to cover a part of the surface of mold resin 30. This reinforces the whole and can reduce the possibility that mold resin 30 is broken from screwing hole portions 32.

This is based on the following reason. The elastic modulus of mold resin 30 without coating resin 40 is, for example, about 20 GPa after curing. By comparison, the elastic modulus coating resin 40 after curing is about 4 GPa, which is extremely lower than that of mold resin 30. Therefore, when fixing is made (see FIG. 5) by fastening members 83 penetrating screw holes 71, 82 in contact with screwing hole portions 32 of mold resin 30 with coating resin 40, the stress in clamping and bonding is smaller, compared with mold resin 30 without coating resin 40. Mold resin 30 covered with coating resin 40 partially on its surface therefore can suppress defects such as cracking of the package, compared with mold resin 30 not covered. Accordingly, the reliability of power semiconductor device 1 is improved.

In addition, power semiconductor device 1 in the present embodiment has the following operation effects. This power semiconductor device 1 has exposed portion 14 not covered with coating resin 40 for soldering to circuit board 80, specifically, at the tip end side of tip end portions 11B, 12B of lead terminals 11, 12. Coating resin 40 is formed such that the region not to be covered with coating resin 40 to serve as exposed portion 14 is inserted in groove 91 of conductive member 90 (see FIG. 12). This can avoid reduction in solderability due to evaporation of the not-removed and left coating resin 40 during soldering, which would otherwise be caused when unnecessary coating resin 40 at tip end portions 11B, 12B is removed by heat after coating resin 40 is formed on the entire surface of lead terminals 11, 12. Coating resin 40 in the present embodiment is formed of a material that is not decomposed at a soldering temperature, such as polyimide resin. Because of this, coating resin 40 is not evaporated during soldering. As described above, the present embodiment can improve the solderability of lead terminals 11, 12 to circuit board 80.

Lead terminals 11, 12 in the present embodiment have tip end portions 11B, 12B positioned on the outside of the package of mold resin 30 in a two-dimensional view. Because of this, the position in the Z direction of conductive member 90 can be adjusted freely. The area of coating resin 40 also can be adjusted easily.

Furthermore, in the method of manufacturing a power semiconductor device in the present embodiment, in a state in which semiconductor element 20 is placed on lead member 10, coating resin 40 is formed for the member including semiconductor element 20 sealed with mold resin 30. In the step of forming coating resin 40, the electrostatic spraying process is used. With this process, compared with any other methods, coating resin 40 can be formed thinly and uniformly on lead terminal 11. Accordingly, the amount of resin material 40A wasted after the forming step can be reduced, and power semiconductor device 1 can be formed at low cost.

Second Embodiment

Figure 16:
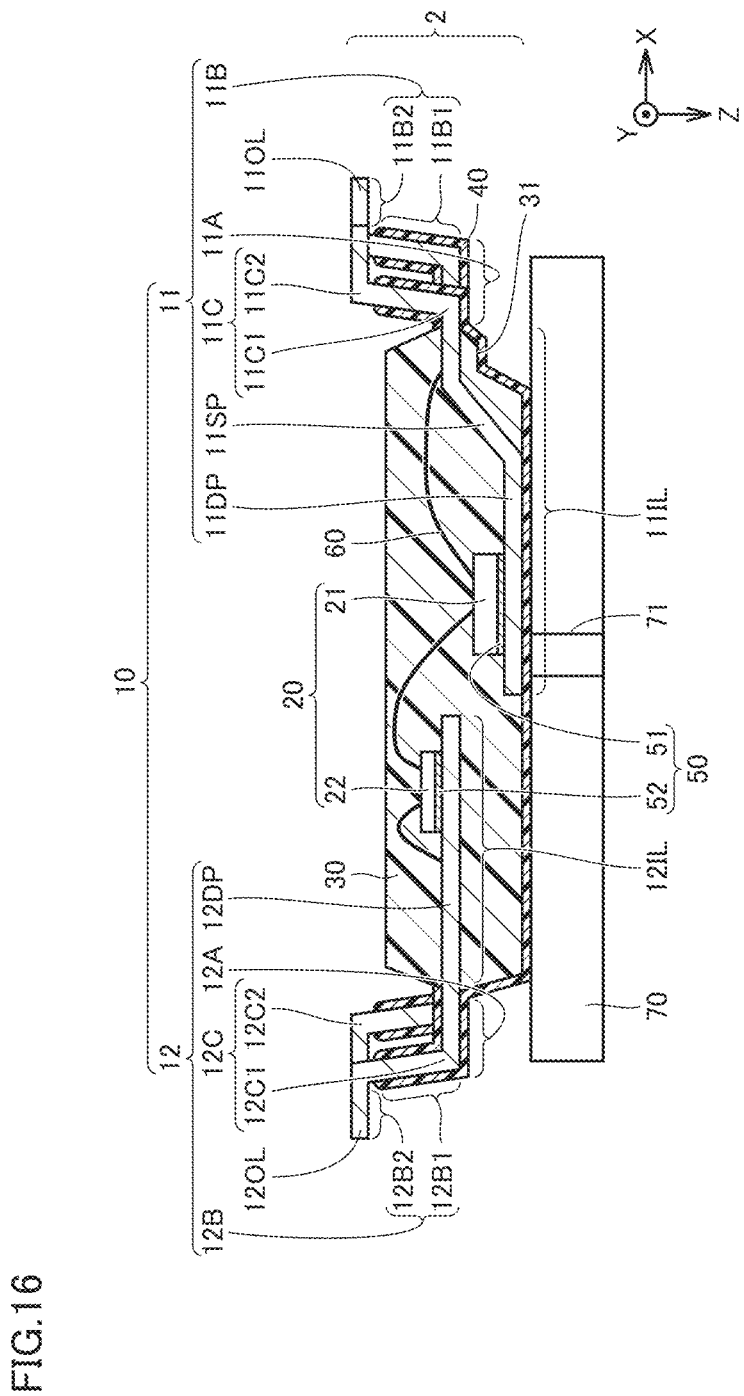
FIG. 16 is a schematic cross-sectional view showing a power semiconductor device according to a second embodiment equipped with a cooling member.
Figure 17:
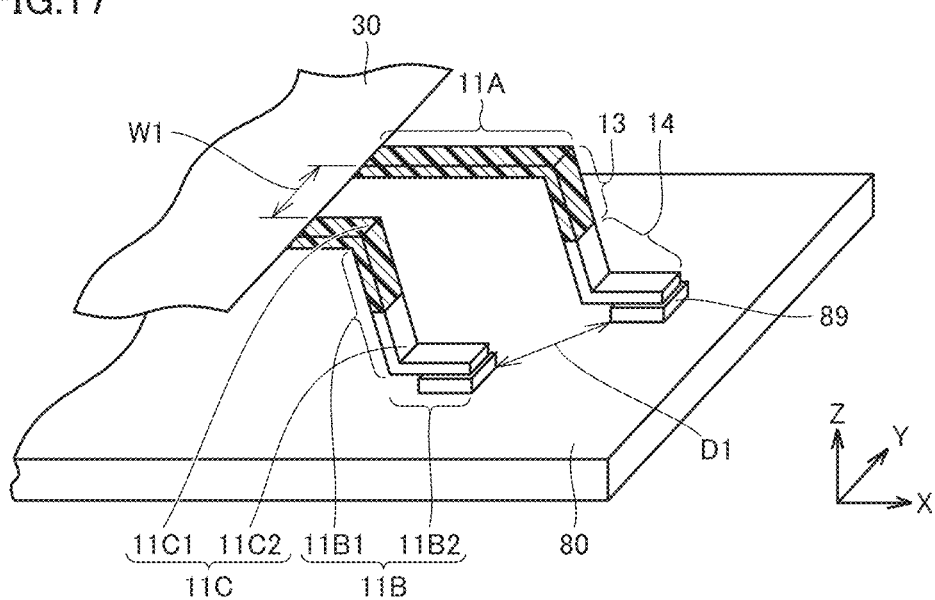
FIG. 17 is an enlarged perspective view schematically showing a lead member extracted from the power semiconductor device according to the second embodiment.
Figure 18:
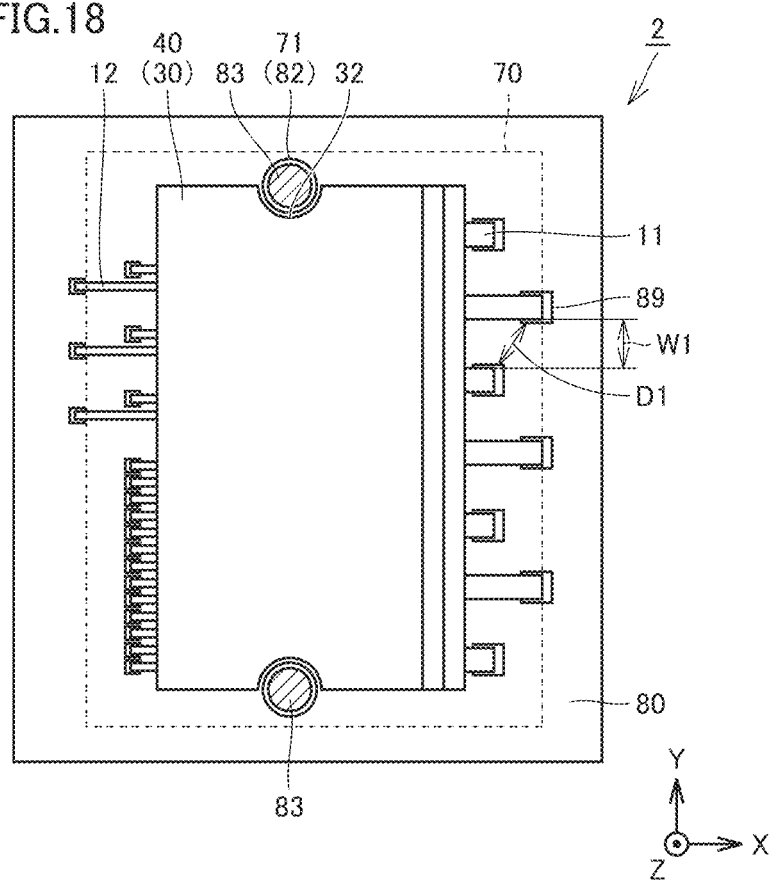
FIG. 18 is a schematic plan view showing the power semiconductor device in FIG. 16 turned upside down and mounted on a circuit board.
Figure 19:
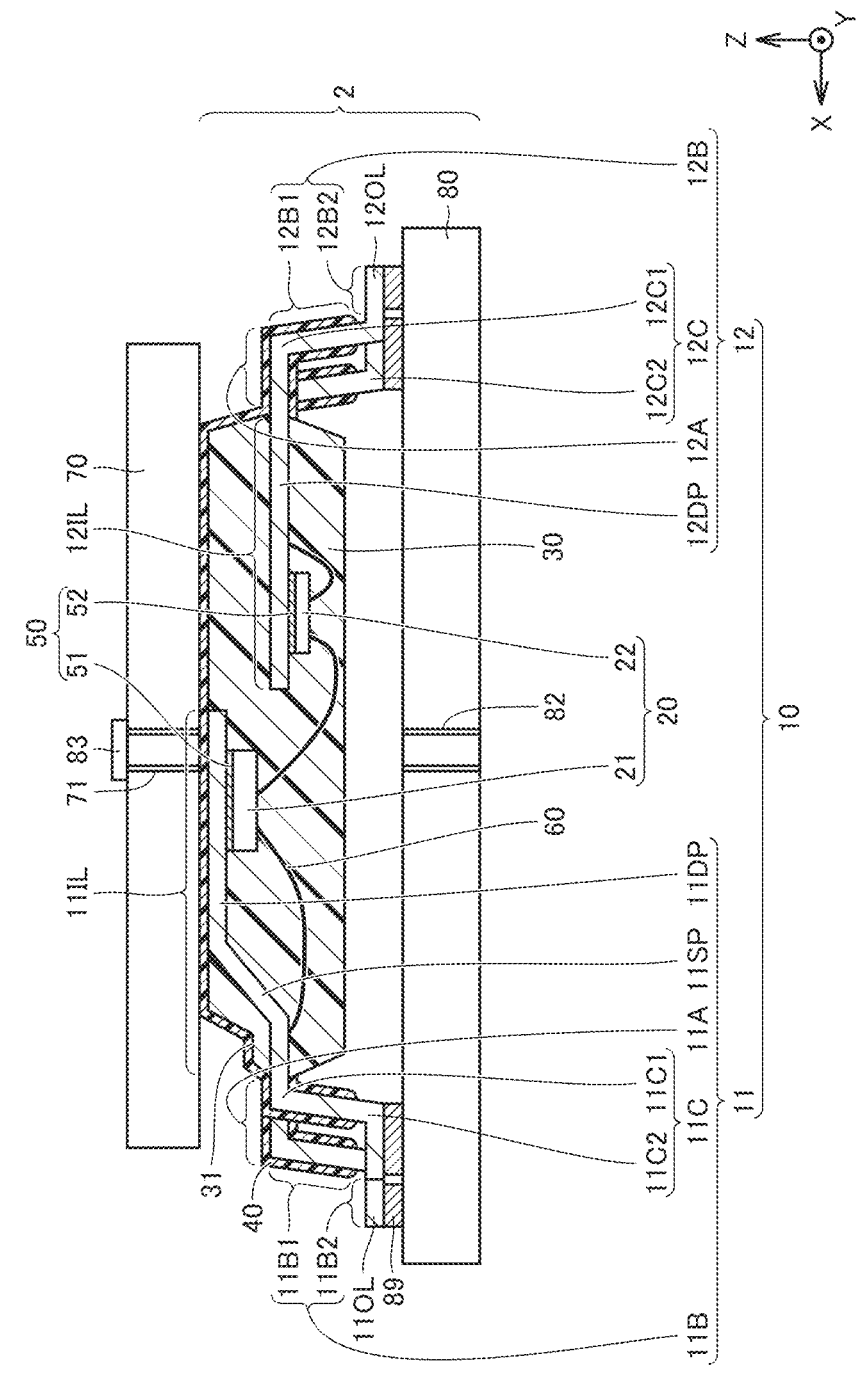
FIG. 19 is a schematic cross-sectional view showing the overview of the power semiconductor device in FIG. 16 mounted on a circuit board.

FIG. 16 is a schematic cross-sectional view showing a power semiconductor device according to a second embodiment equipped with a cooling member. FIG. 17 is an enlarged perspective view schematically showing a lead member extracted from the power semiconductor device according to the second embodiment. FIG. 18 is a schematic plan view showing the power semiconductor device in FIG. 16 turned upside down and mounted on a circuit board. FIG. 19 is a schematic cross-sectional view showing the overview of the power semiconductor device in FIG. 16 mounted on a circuit board. That is, FIG. 16, FIG. 17, FIG. 18, and FIG. 19 respectively correspond to FIG. 1, FIG. 2, FIG. 5, and FIG. 7 in the first embodiment. Referring to FIG. 16 to FIG. 19, an overall configuration of the power semiconductor device in the present embodiment will be described below.

Referring to FIG. 16, a power semiconductor device 2 in the present embodiment has a configuration basically similar to power semiconductor device 1 in the first embodiment. The same constituent elements as those in FIG. 1 are denoted by the same reference signs, and an overlapping description thereof is not always repeated. However, the present embodiment differs from the first embodiment specifically in the shape of tip end portions 11B, 12B of power lead terminal 11 and integrated circuit lead terminal 12.

Specifically, in power semiconductor device 2, each of a plurality of lead terminals 11, 12 has a bending portion at tip end portion 11B, 12B. That is, power lead terminal 11 has, as turn portion 11C, a first turn portion 11C1 and a second turn portion 11C2 as a bending portion. Similarly, integrated circuit lead terminal 12 has, as turn portion 12C, a first turn portion 12C1 and a second turn portion 12C2 as a bending portion.

First turn portion 11C1 of power lead terminal 11 is a turn portion at the boundary between base portion 11A and tip end portion 11B, similar to turn portion 11C in the first embodiment. On the other hand, second turn portion 11C2 of power lead terminal 11 is a bending portion provided so as to divide tip end portion 11B into two. Tip end portion 11B thus includes a first tip end portion 11B1 between first turn portion 11C1 and a second turn portion 11C2, and a second tip end portion 11B2 on the side farther from power semiconductor element 21 than second turn portion 11C2, that is, on the tip end side. When the surface on the upper side in FIG. 16, that is, the Z-direction negative side is the front surface of power lead terminal 11, power lead terminal 11 is bent such that the front surface is concave at first turn portion 11C1. On the other hand, at second turn portion 11C2, power lead terminal 11 is bent such that the front surface is convex.

Similarly, first turn portion 12C1 of integrated circuit lead terminal 12 is a turn portion at the boundary between base portion 12A and tip end portion 12B, similar to turn portion 12C in the first embodiment. On the other hand, second turn portion 12C2 of integrated circuit lead terminal 12 is a bending portion provided so as to divide tip end portion 12B into two. Tip end portion 12B thus includes a first tip end portion 12B1 between first turn portion 12C1 and second turn portion 12C2, and a second tip end portion 12B2 on the side farther from integrated circuit element 22 than second turn portion 12C2, that is, on the tip end side. When the surface on the upper side in FIG. 16, that is, the Z-direction negative side is the front surface of integrated circuit lead terminal 12, integrated circuit lead terminal 12 is bent such that the front surface is concave at first turn portion 12C1. On the other hand, at second turn portion 12C2, integrated circuit lead terminal 12 is bent such that the front surface is convex.

Referring to FIG. 16 and FIG. 17, even in the present embodiment, between a pair of power lead terminals 11 adjacent to each other with spacing W1 in the Y direction, the lengths of base portions 11A extending in the X direction are different from each other. Thus, the distance D1 between tip end portions 11B of a pair of power lead terminals 11 adjacent with spacing W1 with respect to the Y direction is larger than spacing W1. The foregoing is applicable to integrated circuit lead terminal 12.

The surface of base portion 11A of power lead terminal 11 and the surface of a region of tip end portion 11B on the side closer to base portion 11A are covering portion 13 covered with coating resin 40. On the other hand, the surface of a region of tip end portion 11B of power lead terminal 11 on the side farther from base portion 11A is exposed portion 14 not covered with coating resin 40. In FIG. 16, first tip end portion 11B1 is substantially entirely covering portion 13, and second tip end portion 11B2 is substantially entirely exposed portion 14. As an alternative to this manner, as shown in FIG. 17, the base portion 11A side of first tip end portion 11B1 may be covering portion 13, and the second tip end portion 11B2 side of first tip end portion 11B1 and the entire second tip end portion 11B2 may be exposed portion 14. The foregoing is applicable to integrated circuit lead terminal 12.

Referring to FIG. 17, FIG. 18, and FIG. 19, in the present embodiment, a plurality of solder patterns 89 are arranged on the upper main surface in FIG. 17 of circuit board 80. With these, second tip end portions 11B2 on circuit board 80 are bonded to the upper main surface in FIG. 17 of circuit board 80. In the present embodiment, circuit board 80 does not have through holes 81 (see FIG. 5) for receiving lead terminals 11, 12. The surface of the bonded second tip end portion 11B2 preferably has an inclination angle of 8° or less relative to the main surface of circuit board 80. The inclination angle may be 5° or less, or the inclination angle may be zero. That is, the surface of second tip end portion 11B2 may be connected along the main surface of circuit board 80. The foregoing is applicable to second tip end portion 12B2 of integrated circuit lead terminal 12.

In the present embodiment, as shown in FIG. 17 to FIG. 19, solder patterns 89 are supplied in advance on the main surface of circuit board 80. Second tip end portions 11B2, 12B2 are placed on solder patterns 89. In this case, other surface-mounted parts are also placed on the main surface of circuit board 80 with solder patterns or the like interposed. A part of power semiconductor device 2 including second tip end portions 11B2, 12B2 and mold resin 30 is bonded on solder patterns 89 by a reflow soldering process, simultaneously with other surface-mounted parts.

In the present embodiment, coating resin 40 is formed by the electrostatic spraying process, in the same manner as in the first embodiment.

The present embodiment differs from the first embodiment in the respects described above. However, the present embodiment is basically similar to the first embodiment in other respects.

The operation effects in the present embodiment are basically similar to the first embodiment. However, in addition, the present embodiment achieves the following effects.

In power semiconductor device 2 in the present embodiment, the section including lead member 10, semiconductor element 20, and mold resin 30 is bonded on circuit board 80 by a reflow soldering process, simultaneously with other surface-mounted parts. As for parts such as lead member 10 of power semiconductor device 1 in the first embodiment, lead terminals 11, 12 are inserted and soldered, mainly manually, in through holes 81 of circuit board 80 having a DIP (Dual Inline Package) structure. By contrast, power semiconductor device 2 in the second embodiment is a configuration called SOP (Small Outline Package) assumed to be subjected to reflow soldering, simultaneously with other surface-mounted parts. That is, power semiconductor device 2 is a structure more suitable for manufacturing in automated lines, compared with power semiconductor device 1. Therefore, for example, compared with when some parts of power semiconductor device 2 and other surface-mounted parts are bonded on circuit board 80 in separate steps, the step of mounting the members on circuit board 80 can be simplified.

In other respects, as shown in FIG. 17, it is preferable that lead terminals 11, 12 in the present embodiment are bonded to circuit board 80 such that first tip end portion 11B1 is not orthogonal to base portion 11A and second tip end portion 11B2 and is kept at an angle slightly larger than the right angle. In this way, an electric line of force easily comes around to the back side when the electrostatic spraying process is used, and a film deposition on the back side is facilitated. The surface of the bonded second tip end portion 11B2 preferably has an inclination angle of, for example, 8° or less relative to the main surface of circuit board 80. With this, the electric line of force comes around to second tip end portion 11B2 even more easily. Based on this, the deposition of coating resin 40 onto second tip end portion 11B2 is even further facilitated.

In power semiconductor device 2 in the present embodiment using the reflow soldering process, mold resin 30 absorbs moisture during the reflowing step. Mold resin 30 therefore may peel from the surface of each member such as die pad portion 11DP sealed in mold resin 30. However, in the present embodiment, for example, the surface of die pad portion 11DP exposed from mold resin 30 is covered with coating resin 40, in the same manner as in the first embodiment. Accordingly, moisture absorption is suppressed at the portion of mold resin 30 covered with coating resin 40. The portion of die pad portion 11DP exposed from mold resin 30 is less likely to peel off from the adjacent mold resin 30.

Third Embodiment

Figure 20:
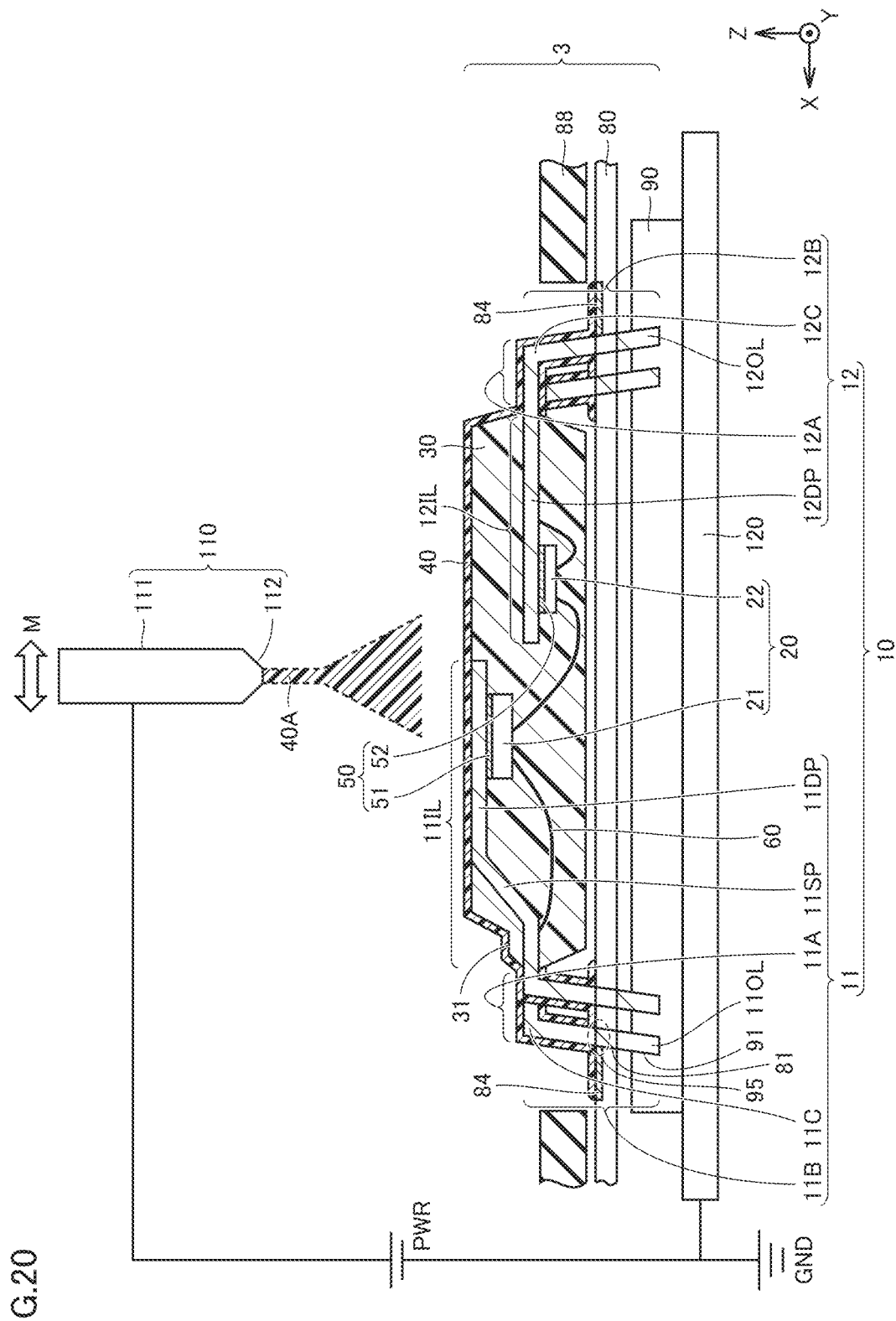
FIG. 20 is a schematic cross-sectional view showing a step of a method of manufacturing a power semiconductor device according to a third embodiment.
Figure 21:
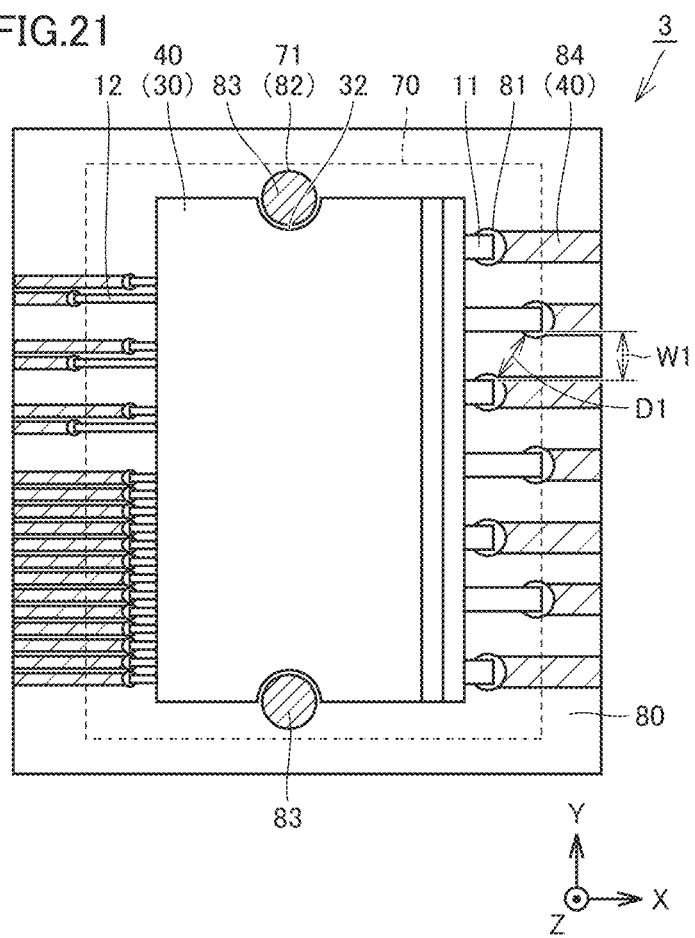
FIG. 21 is a schematic plan view showing the power semiconductor device in FIG. 20 mounted on a circuit board.
Figure 22:
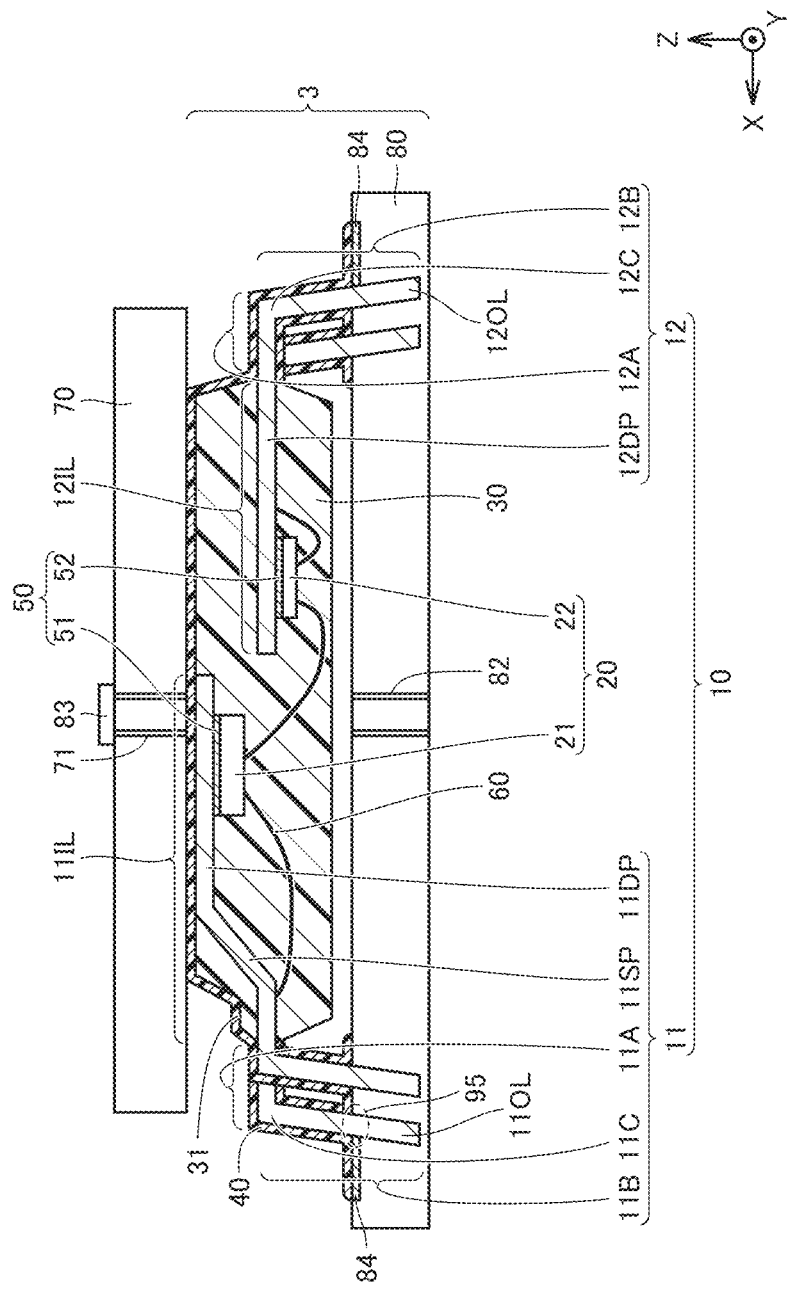
FIG. 22 is a schematic cross-sectional view showing the overview of the power semiconductor device in FIG. 20 mounted on a circuit board.

FIG. 20 is a schematic cross-sectional view showing a step of a method of manufacturing a power semiconductor device according to a third embodiment. FIG. 21 is a schematic plan view showing the power semiconductor device in FIG. 20 mounted on a circuit board. FIG. 22 is a schematic cross-sectional view showing the overview of the power semiconductor device in FIG. 20 mounted on a circuit board. That is, FIG. 20, FIG. 21, and FIG. 22 respectively correspond to FIG. 9, FIG. 5, and FIG. 7 in the first embodiment. In the following description, the same constituent elements as those in the first and second embodiments are denoted by the same reference signs and an overlapping description is not always repeated.

Referring to FIG. 20, in the method of manufacturing a power semiconductor device in the present embodiment, basically, a similar process to the step shown in FIG. 9 in the first embodiment is performed. That is, a spray of resin material 40A is supplied using the electrostatic spraying process to at least a part (denoted by a reference sign 3 in FIG. 20) of the member ultimately serving as a power semiconductor device 3. Then, a spray of resin material 40A charged to a high voltage is deposited on the surface of mold resin 30, the surface of die pad portion 11DP on the opposite side to the surface on which power semiconductor element 21 is placed, and a part of the surfaces of base portions 11A, 12A and tip end portions 11B, 12B of lead terminals 11, 12, in the same manner as in FIG. 9. Coating resin 40 is thus formed on the portions described above. However, in FIG. 20, the step of forming coating resin 40 is performed in a state in which at least a part of the member that is the member serving as power semiconductor device 3 is mounted on circuit board 80. Consequently, power semiconductor device 3 including circuit board 80 is formed. In this respect, the present embodiment differs from the first embodiment in which coating resin 40 is formed before at least a part of the member serving as power semiconductor device 1 is mounted on circuit board 80.

As shown in FIG. 20, circuit board 80, conductive member 90, and stage 120 are installed so as to be overlapped two-dimensionally in this order from the upper side in the drawing (Z-direction positive side). Through holes 81 of circuit board 80 and grooves 91 of conductive member 90 are arranged to overlap each other in a two-dimensional view. Conductive member 90 may be integrally formed as shown in FIG. 9 or may be formed as an assembly of three parts as shown in FIG. 11.

For example, outer lead portions 11OL, 12OL of lead terminals 11, 12 in the member serving as power semiconductor device 3 with bent lead terminals 11, 12 in the same manner as in power semiconductor device 1 in the first embodiment are inserted into through holes 81 and grooves 91 immediately below. That is, here, outer lead portions 11OL, 12OL penetrate through holes 81 and are inserted in grooves 91. At this point of time, lead terminals 11, 12 may be fixed to through holes 81 by solder.

A plurality of wiring portions 84 are formed on the upper main surface of circuit board 80. These wiring portions 84 have electrical continuity with a plurality of lead terminals 11, 12 of power semiconductor device 3 mounted on circuit board 80. It is therefore preferable that wiring portion 84 is formed, for example, in a region adjacent to through hole 81 in circuit board 80.

In spraying of resin material 40A in the electrostatic spraying process similar to the first embodiment, a mask 88 is provided to overlay circuit board 80 on the side having wiring portion 84, that is, the upper side in FIG. 20. Mask 88 is arranged so as to cover the center portion of the member serving as power semiconductor device 3 and a region excluding immediately above at least a partial region of wiring portion 84, from the upper side in FIG. 20. The region covered with mask 88 is a region to which resin material 40A is not supplied in the electrostatic spraying process. To put it another way, resin material 40A is supplied to a region other than the region covered with mask 88. Thus, coating resin 40 is formed on circuit board 80 so as to cover at least a part of wiring portions 84 formed on circuit board 80 and having electrical continuity with a plurality of lead terminals 11, 12.

As described above, a part of the member serving as power semiconductor device 3 with the bent lead terminals 11, 12 in the same manner as power semiconductor device 1 in the first embodiment is fixed to circuit board 80, and coating resin 40 is formed at wiring portions 84 on circuit board 80. However, the present embodiment is not limited thereto, and a part of the member serving as power semiconductor device 3 with the bent lead terminals 11, 12 in the same manner as power semiconductor device 2 in the second embodiment may be fixed to circuit board 80, for example, by solder patterns 89, and coating resin 40 may be formed at wiring portions 84 on circuit board 80. Even when the member serving as power semiconductor device 3 similar to power semiconductor device 2 in the second embodiment is fixed, wiring portions 84 can have electrical continuity with lead terminals 11, 12, in the same manner as when the member serving as power semiconductor device 3 similar to power semiconductor device 1 in the first embodiment is fixed. Since power semiconductor device 2 in the second embodiment does not require through holes 81, conductive member 90 and stage 120 need not be used in the step of the electrostatic spraying process.

Referring to FIG. 21 and FIG. 22, in power semiconductor device 3 formed by the step in FIG. 20, mold resin 30, immediately above lead terminals 11, 12, and at least a part of wiring portions 84 are covered with coating resin 40.

The present embodiment differs from the first and second embodiments in these respects described above. However, the present embodiment is basically similar to the first and second embodiments in other respects.

The operation effects in the present embodiment are basically similar to the first and second embodiments. However, in addition, the present embodiment achieves the following effects.

According to the present embodiment, not only power lead terminal 11 and integrated circuit lead terminal 12 but also wiring portions 84 adjacent thereto are at least partially covered with coating resin 40. Thus, the regions in which lead terminals 11, 12 are fixed to circuit board 80 by solder, such as the region adjacent to boundary portion 95 (see FIG. 22), are covered with coating resin 40. This suppresses short-circuiting between the bonded portions by solder and achieves excellent insulation between a plurality of lead terminals 11, 12. Based on this, the distance between a plurality of lead terminals 11, 12 can be reduced, and consequently, power semiconductor device 3 can be miniaturized.

As shown in FIG. 21, wiring portions 84 are at least partially covered with coating resin 40. Therefore, compared with when wiring portions 84 are not covered with coating resin 40, the heat dissipation from wiring portion 84 is excellent. The polyimide resin forming coating resin 40 has a thermal conductivity of about 1.0 W/mK. On the other hand, the thermal conductivity of air is about 0.02 W/mK. The covering with coating resin 40 therefore facilitates escape of heat from wiring portions 84 to the outside, compared with no covering. Heat dissipation can be enough even when circuit board 80 is miniaturized. Accordingly, power semiconductor device 3 can be miniaturized.

Furthermore, it is preferable that coating resin 40 covers continuously from the surface of circuit board 80 to the surfaces of lead terminals 11, 12. With this, the adhesion strength between circuit board 80 and lead terminals 11, 12 is increased. Therefore, even when vibration and heat cycle occur during use of power semiconductor device 3, peeling of solder that fixes circuit board 80 and lead terminals 11, 12 can be suppressed.

Fourth Embodiment

Figure 23:
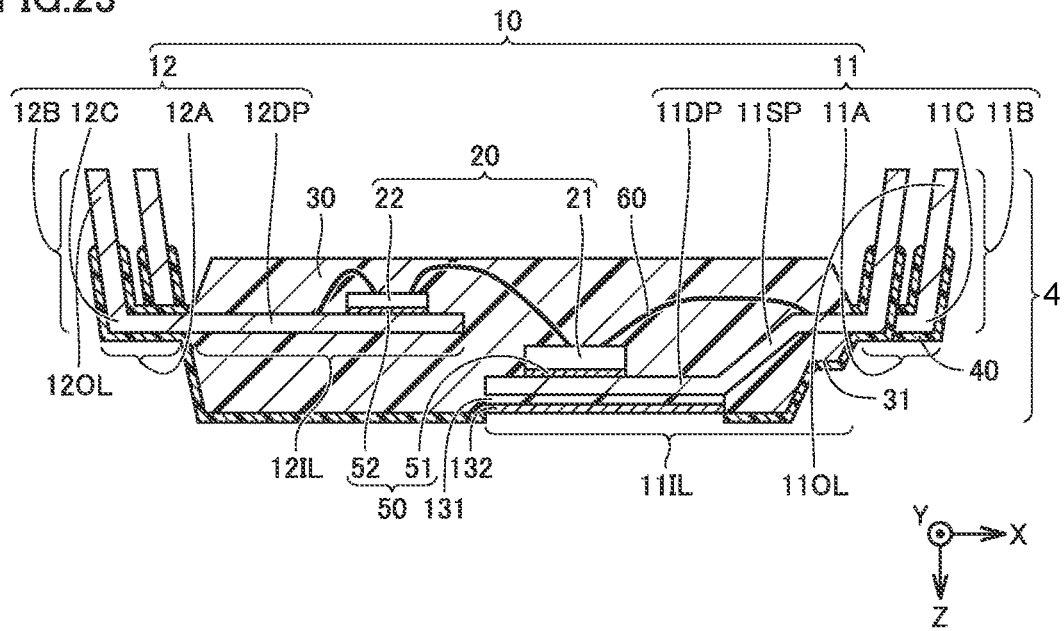
FIG. 23 is a schematic cross-sectional view showing a power semiconductor device according to a fourth embodiment.

FIG. 23 is a schematic cross-sectional view showing a power semiconductor device according to a fourth embodiment. In the following examples, the same constituent elements as those in the foregoing examples are denoted by the same reference signs and an overlapping description thereof is not always repeated. Referring to FIG. 23, in a power semiconductor device 4 in the present embodiment, each of a plurality of lead terminals 11 has die pad portion 11DP on which power semiconductor element 21 is placed, in the same manner as the other examples. Coating resin 40 at each of lead terminals 11 is formed only in at least a partial region in a range from the surface of base portion 11A to the region on the base portion 11A side from die pad portion 11DP. In other words, coating resin 40 is not formed on the surface of die pad portion 11DP. Also here, coating resin 40 may be arranged so as to cover the surface of mold resin 30, at a portion between the lower surface of base portion 11A and the lower surface of die pad portion 11DP, in the same manner as the foregoing other examples.

In FIG. 23, the lower surface in FIG. 23 of die pad portion 11DP on the opposite side to the surface on which power semiconductor element 21 is placed is buried in mold resin 30. In other words, in FIG. 23, the lower surface of die pad portion 11DP is not exposed from mold resin 30. On the lower surface of die pad portion 11DP, for example, a copper foil 132 is formed as a metal foil with an insulating layer 131 interposed. The lower surface of copper foil 132 is therefore generally exposed from mold resin 30.

Because of the presence of insulating layer 131 and copper foil 132, in power semiconductor device 4, coating resin 40 at each of a plurality of lead terminals 11 is not formed on the surface of die pad portion 11DP. Coating resin 40 on lead terminal 11 is therefore formed such that its end portion is the region on the base portion 11A side from die pad portion 11DP. Coating resin 40 is also not formed on the surface of copper foil 132 exposed from mold resin 30.

Figure 24:
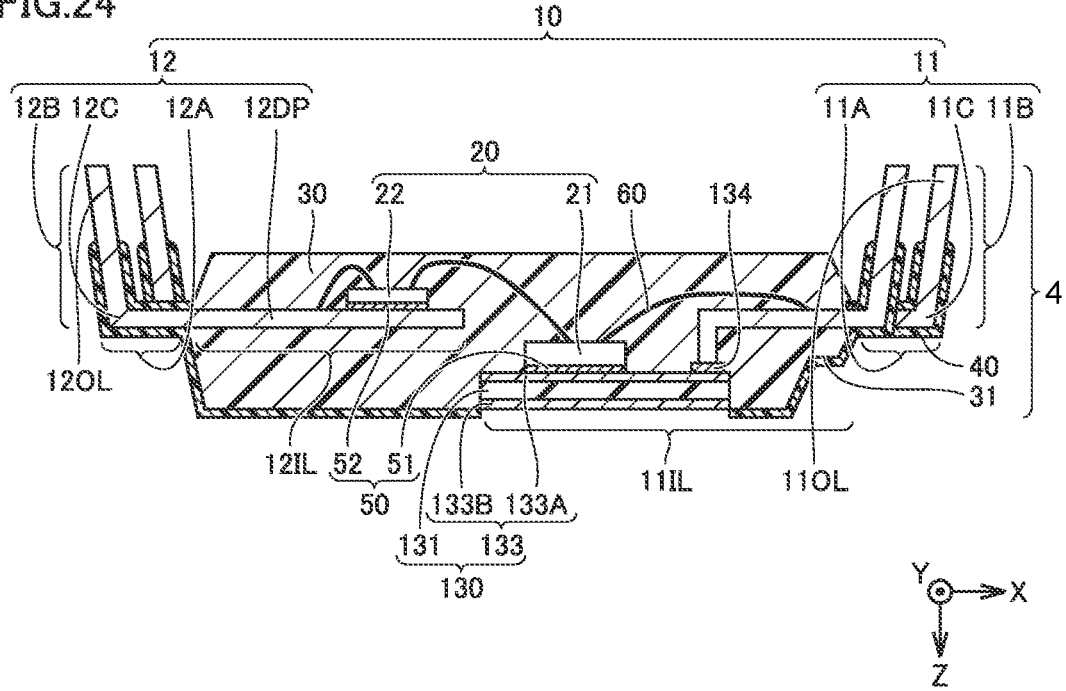
FIG. 24 is a schematic cross-sectional view showing a power semiconductor device according to a modification of the fourth embodiment.

FIG. 24 is a schematic cross-sectional view showing a power semiconductor device according to a modification of the fourth embodiment. Referring to FIG. 24, this power semiconductor device 4 basically has a configuration similar to that in FIG. 23. However, in FIG. 24, each of a plurality of lead terminals 11 does not have die pad portion 11DP. Instead of die pad portion 11DP, a DBC board 130 is arranged in mold resin 30. DBC board 130 includes an insulating layer 131 and a pair of copper plates 133 sandwiching insulating layer 131. Specifically, a pair of copper plates 133 includes a copper plate 133A and a copper plate 133B. Insulating layer 131 is formed of a ceramic material such as alumina. In this manner, insulating layer 131 has both heat dissipation performance and insulation performance. Copper plate 133A is arranged on one surface, that is, the upper main surface in FIG. 24 of insulating layer 131. Copper plate 133B is arranged on the other surface, that is, the lower main surface in FIG. 24 of insulating layer 131. Power semiconductor element 21 is placed on DBC board 130. Specifically, power semiconductor element 21 is placed on the upper main surface of copper plate 133A in FIG. 24. Copper plate 133A therefore functions similarly to die pad portion 11DP in the foregoing examples.

In each of a plurality of lead terminals 11, an end portion on the opposite side to outer lead 11OL, that is, an end portion in the inside of mold resin 30 is bonded onto copper plate 133A by conductive member 134 such as solder. In FIG. 24, coating resin 40 is not formed on copper plate 133A functioning similarly to die pad portion 11DP and DBC board 130 including the same, in the same manner as in FIG. 23. That is, coating resin 40 is formed only in at least a partial region in a range from the surface of base portion 11A to the region on the base portion 11A side from copper plate 133A.

As described above, in power semiconductor device 4, the surface of die pad portion 11DP is not exposed from mold resin 30, and coating resin 40 is not formed there. In this respect, power semiconductor device 4 differs from power semiconductor devices 1, 2, 3.

Although external cooling member 70 is not illustrated in FIG. 23 and FIG. 24 for convenience of explanation, external cooling member 70 may be installed in the same manner as in FIG. 1 in the first embodiment.

Figure 25:
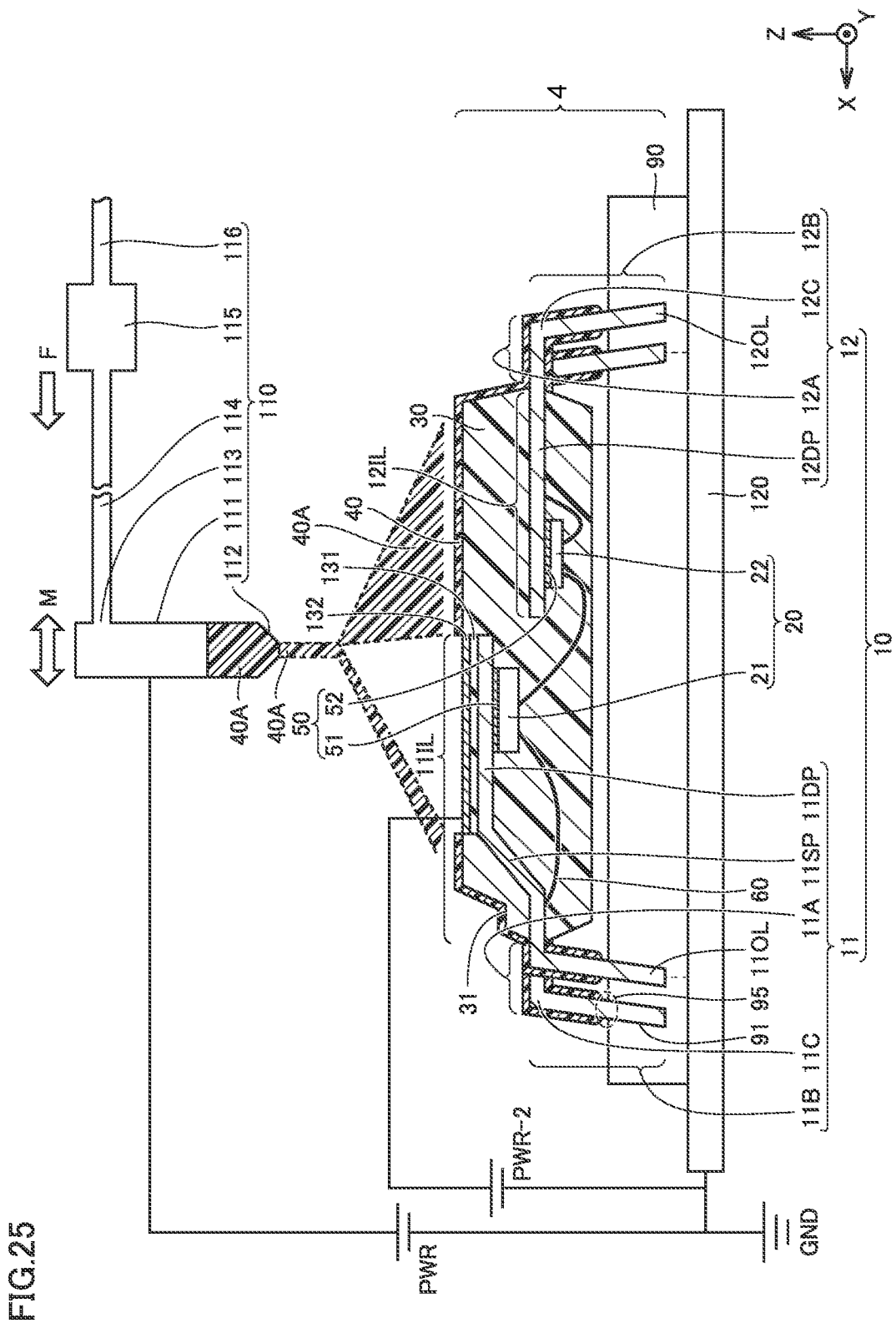
FIG. 25 is a schematic cross-sectional view showing a step of a method of manufacturing a power semiconductor device according to the fourth embodiment.

A method of manufacturing power semiconductor device 4 in FIG. 23 will now be described with reference to FIG. 25. FIG. 25 is a schematic cross-sectional view showing a step of a method of manufacturing a power semiconductor device according to the fourth embodiment. FIG. 25 corresponds to the step in FIG. 9 in the first embodiment. Referring to FIG. 25, in the method of manufacturing a power semiconductor device in the present embodiment, first of all, a plurality of lead terminals 11 having die pad portion 11DP on which power semiconductor element 21 is placed are prepared. Copper foil 132 is formed on the upper surface in FIG. 25 of die pad portion 11DP on the opposite side to the side on which power semiconductor element 21 is placed, with insulating layer 131 interposed.

Subsequently, a charged resin material diffused into a spray adheres to the surface of at least a part of the member that is the member ultimately serving as power semiconductor device 4, by the electrostatic spraying process, in the same manner as the step in FIG. 9. Coating resin 40 is thus formed. Here, the upper surface in FIG. 25 of copper foil 132 is exposed from mold resin 30. In the step in FIG. 25, the positive electrode of a power supply PWR2 is connected to the exposed surface of copper foil 132. The positive electrode of a power supply PWR is connected to resin material 40A that is not yet coated as coating resin 40. Copper foil 132 is then charged to the positive polarity that is the same polarity as resin material 40A. In this state, the process by the electrostatic spraying process is performed to form coating resin 40.

The operation effects of the present embodiment will now be described.

According to the present embodiment, coating resin 40 at each of lead terminals 11 is formed only in a range from the surface of base portion 11A to the region on the base portion 11A side from die pad portion 11DP. Therefore, die pad portion 11DP can be formed of a metal material with higher heat dissipation performance than that of coating resin 40 and can release the heat from power semiconductor element 21 to the outside more efficiently. Specifically, heat dissipation from die pad portion 11DP to, for example, external cooling member 70 therebelow is performed by copper foil 132 as a metal foil. Heat dissipation is thus higher than by coating resin 40. The insulation between die pad portion 11DP and external cooling member 70 is ensured by insulating layer 131.

Figure 26:
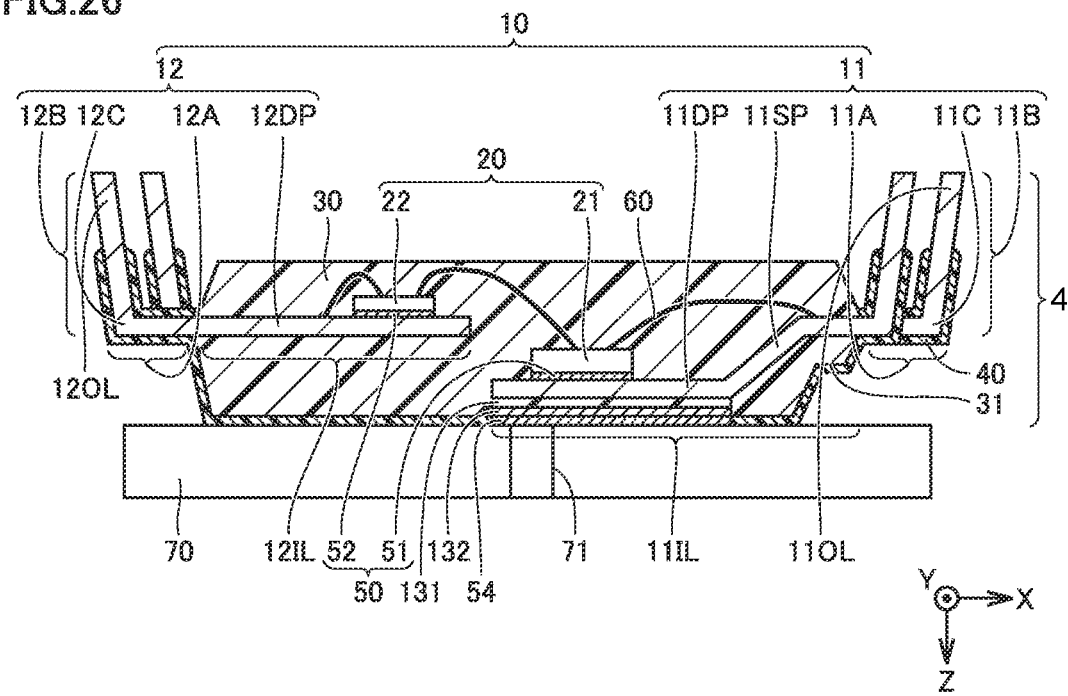
FIG. 26 is a schematic cross-sectional view showing the power semiconductor device according to the fourth embodiment equipped with a cooling member.

FIG. 26 is a schematic cross-sectional view showing the power semiconductor device according to the fourth embodiment equipped with a cooling member. Referring to FIG. 26, specifically, copper foil 132 in power semiconductor device 4 is connected to external cooling member 70, with conductive member 54 such as solder interposed. Thus, heat dissipation performance is significantly improved in the heat dissipation route from power semiconductor element 21 to external cooling member 70 through die pad portion 11DP, copper foil 132, and conductive member 54.

In the manufacturing method in the present embodiment, in the step of forming coating resin 40, copper foil 132 as a metal foil and resin material 40A are charged to the same polarity. In this way, in forming coating resin 40 by the electrostatic spraying process, resin material 40A avoids copper foil 132 and coats the surface of the region excluding copper foil 132. Coating resin 40 is thus formed only on the region excluding copper foil 132. With this, higher heat dissipation performance is achieved by copper foil 132 as described above than by coating resin 40. According to the present embodiment, since resin material 40A provides coating excluding copper foil 132, a mask for coating of resin material 40A is not necessary. This mask need to be discarded and replaced every time coating is performed, leading to a higher manufacturing cost. According to the present embodiment, which does not require a mask, power semiconductor device 4 can be manufactured at lower cost.

Fifth Embodiment

Figure 27:
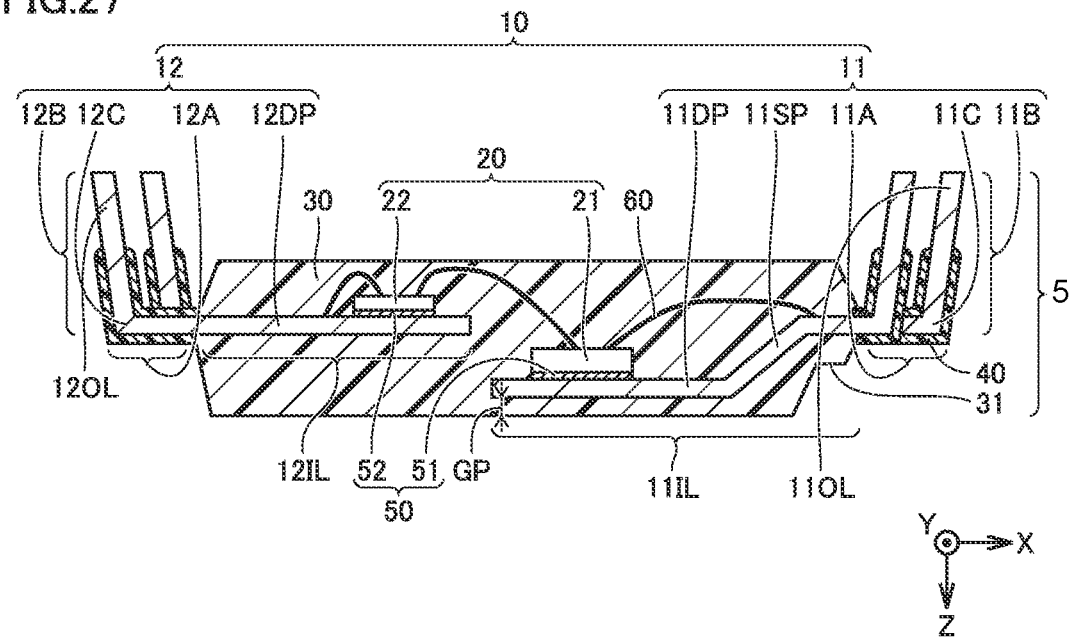
FIG. 27 is a schematic cross-sectional view showing a power semiconductor device according to a fifth embodiment.

FIG. 27 is a schematic cross-sectional view showing a power semiconductor device according to a fifth embodiment. Referring to FIG. 27, in a power semiconductor device 5 in the present embodiment, the lower surface in FIG. 27 of die pad portion 11DP is buried in mold resin 30 and not exposed from mold resin 30. In this respect, the present embodiment is similar to the fourth embodiment in FIG. 23. In FIG. 27, it is preferable that the gap GP between the lower surface of mold resin 30 and the lowermost surface of mold resin 30 is 350 µm or more. It is preferable that the lower surface of die pad portion 11DP in FIG. 27 and the lowermost surface of mold resin 30 are arranged substantially parallel to each other. In this way, reduction in reliability of the power semiconductor device due to inclination of die pad portion 11DP as represented by the comparative example in FIG. 13 can be suppressed.

In FIG. 27, coating resin 40 is not formed either on the surface of die pad portion 11DP and on the surface of mold resin 30, at the portion between the lower surface of base portion 11A and the lower surface of die pad portion 11DP. In FIG. 27, coating resin 40 is formed only on the surfaces of base portions 11A, 12A of outer lead portions 11OL, 12OL and the surface of covering portion 13. Therefore, no coating resin 40 is formed on the surfaces of inner lead portions 11IL, 12IL and the surface of mold resin 30.

Figure 28:
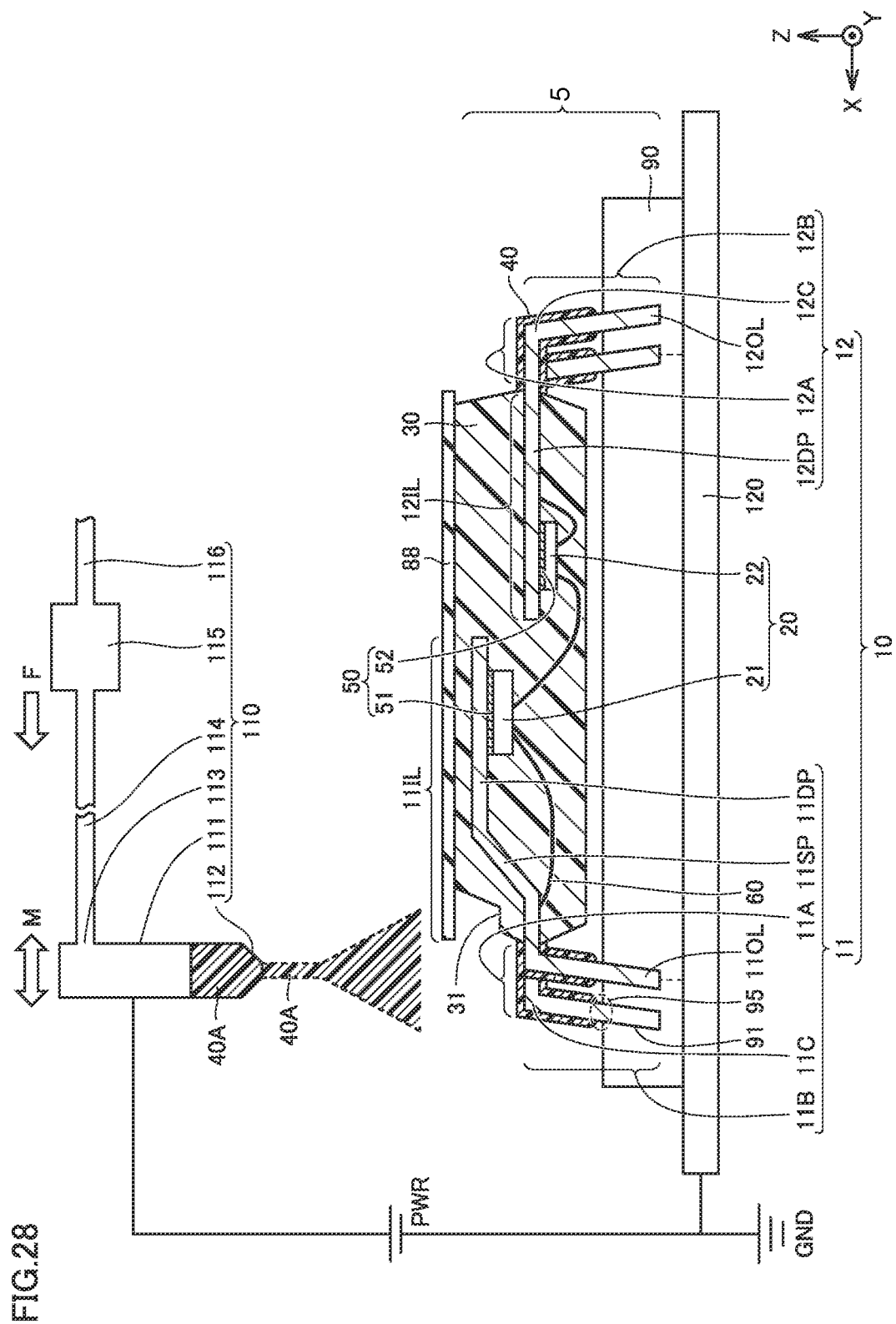
FIG. 28 is a schematic cross-sectional view showing a step of a method of manufacturing a power semiconductor device according to the fifth embodiment.

FIG. 28 is a schematic cross-sectional view showing a step of a method of manufacturing a power semiconductor device according to the fifth embodiment. FIG. 28 corresponds to the step in FIG. 9 in the first embodiment. Referring to FIG. 28, in the method of manufacturing a power semiconductor device in the present embodiment, mask 88 is placed on the surface of mold resin 30 in the coating step. In this state, resin material 40A is supplied onto the member serving as a power semiconductor device by the electrostatic spraying process, in the same manner as in other examples. Thus, coating resin 40 is formed at a region excluding mold resin 30 covered with mask 88, that is, the surfaces of base portions 11A, 12A of outer leads 11OL, 12OL and the surface of covering portion 13. As shown in FIG. 28, exposed portions 14 of outer leads 11OL, 12OL are inserted in grooves 91 of conductive member 90 and are not coated.

The minimum required operation effect in the present embodiment is to suppress short-circuiting between soldered portions of a pair of lead terminals even when the distance between the pair of lead terminals adjacent to each other is short. In this respect, coating resin 40 is formed at least on the surfaces of base portions 11A of a plurality of lead terminals 11. According to the present embodiment, in view of the above, only the minimum region that requires coating resin 40 can be coated efficiently. Power semiconductor device 5 therefore can be manufactured at low cost with the minimum amount of resin material 40A to be used.

Six Embodiment

In the present embodiment, the power semiconductor device according to the foregoing first to fifth embodiments is applied to a power conversion device. Although the present invention is not limited to a power conversion device of a certain type, a case where the present invention is applied to a three-phase inverter will be described as a sixth embodiment.

Figure 29:
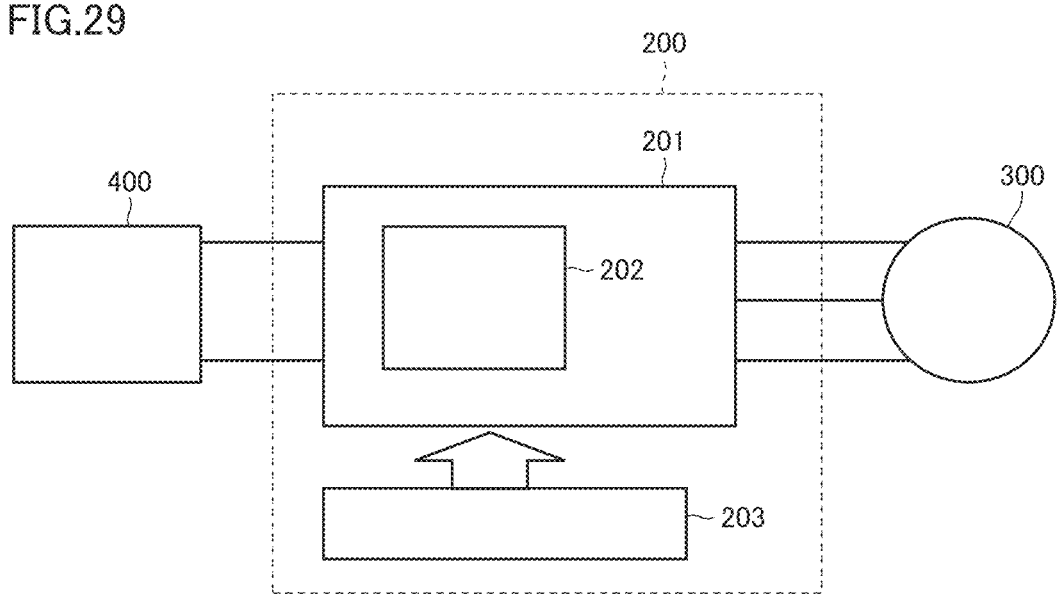
FIG. 29 is a block diagram showing a configuration of a power conversion system to which a power conversion device according to a sixth embodiment is applied.

FIG. 29 is a block diagram showing a configuration of a power conversion system to which a power conversion device according to the sixth embodiment is applied. The power conversion system shown in FIG. 29 includes a power supply 400, a power conversion device 200, and a load 300. Power supply 400 is a DC power supply and supplies DC power to power conversion device 200. Power supply 400 can be configured with, for example, but not limited to, a DC system, a solar cell, or a storage battery or may be configured with a rectifying circuit or an AC/DC converter connected to an AC system. Power supply 400 may be configured with a DC/DC converter that converts DC power output from a DC system to intended power.

Power conversion device 200 is a three-phase inverter connected between power supply 400 and load 300 and converts DC power supplied from power supply 400 to AC power to supply AC power to load 300. As shown in FIG. 29, power conversion device 200 includes a main conversion circuit 201 to convert input DC power to AC power for output and a control circuit 203 to output a control signal for controlling main conversion circuit 201 to main conversion circuit 201.

Load 300 is a three-phase motor driven by AC power supplied from power conversion device 200. Load 300 is not limited to a certain application and is a motor mounted on a variety of electric devices and used as a motor for, for example, hybrid cars, electric cars, rail vehicles, elevators, or air conditioners.

The detail of power conversion device 200 will be described below. Main conversion circuit 201 includes a switching element (not shown) and a freewheeling diode (not shown). The switching element switches voltage supplied from power supply 400, whereby main conversion circuit 201 converts DC power supplied from power supply 400 to AC power and supplies the AC power to load 300. There are a variety of circuit configurations for main conversion circuit 201, but main conversion circuit 201 according to the present embodiment is a two-level three-phase full bridge circuit and may include six switching elements and six freewheeling diodes in anti-parallel with the respective switching elements. IGBT 21 and integrated circuit element 22 included in power semiconductor device 1 to 5 according to any one of the foregoing first to fifth embodiments can be applied as each switching element and each freewheeling diode of main conversion circuit 201. Power semiconductor device 1 to 5 according to any one of the foregoing first to fifth embodiments can be applied as power semiconductor module 202 included in main conversion circuit 201. Six switching elements are connected in series two by two to form upper and lower arms, and the upper and lower arms constitute a phase (U phase, V phase, W phase) of the full bridge circuit. The output terminals of the upper and lower arms, that is, three output terminals of main conversion circuit 201 are connected to load 300.

Main conversion circuit 201 also includes a drive circuit (not shown) that drives each switching element. The drive circuit may be contained in power semiconductor module 202 or may be provided outside power semiconductor module 202. The drive circuit generates a drive signal for driving a switching element included in main conversion circuit 201 and supplies the drive signal to the control electrode of the switching element of main conversion circuit 201. Specifically, in accordance with a control signal from control circuit 203, a drive signal for turning on the switching element and a drive signal for turning off the switching element are output to the control electrode of each switching element.

In power conversion device 200 according to the present embodiment, power semiconductor device 1 to 5 according to any one of the foregoing first to fifth embodiments can be applied as power semiconductor module 202 included in main conversion circuit 201, as described above. Power conversion device 200 according to the present embodiment therefore can be miniaturized as power semiconductor device 1 to 5 is miniaturized.

In the present embodiment, the present invention is applied to a two-level three-phase converter. However, the present invention is not limited thereto and can be applied to a variety of power conversion devices. In the present embodiment, a two-level power conversion device is employed. However, a three-level power conversion device may be employed. Alternatively, a multi-level power conversion device may be employed. When a power conversion device supplies power to a single-phase load, the present invention can be applied to a single-phase inverter. When a power conversion device supplies power to a DC load, for example, the present invention can be applied to a DC/DC converter or an AC/DC converter.

The power conversion device to which the present invention is applied is not limited to a case where the load is a motor and can be built in, for example, a power supply device for an electric discharge machine or a laser processing machine or a power supply device for an induction heating cooker or a contactless power supply system. The power conversion device to which the present invention is applied can be used as a power conditioner for a solar power generation system or a power storage system.

The features illustrated in the foregoing embodiments (and examples included therein) can be applied in combination as appropriate to an extent that is technically consistent.

The embodiments disclosed here should be understood as being illustrative rather than being limitative in all respects. The scope of the present invention is shown not in the foregoing description but in the claims, and it is intended that all modifications that come within the meaning and range of equivalence to the claims are embraced here.

REFERENCE SIGNS LIST 1, 2, 3, 4, 5 power semiconductor device, 10 lead member, 11 power lead terminal, 11A, 12A base portion, 11B, 12B tip end portion, 11C, 12C turn portion, 11C1, 12C1 first turn portion, 11C2, 12C2 second turn portion, 11DP, 12DP die pad portion, 11IL, 12IL inner lead portion, 11OL, 12OL outer lead portion, 11SP step portion, 12 integrated circuit lead terminal, 13 covering portion, 14, EP exposed portion, 20 semiconductor element, 21 power semiconductor element, 22 integrated circuit element, 30 mold resin, 30A tablet resin, 30B, 30C resin burr, 31 mold resin step portion, 32 screwing hole portion, 40 coating resin, 40A resin material, 50, 51, 52 conductive adhesive, 53 heat dissipation member, 54, 134 conductive member, 60 wire, 70 external cooling member, 71, 82 screw hole, 80 circuit board, 81 through hole, 83 fastening member, 84 wiring portion, 88 mask, 89 solder pattern, 90 conductive member, 90A first conductive member, 90B second conductive member, 90C third conductive member, 91 groove, 91A first groove, 91B second groove, 91C third groove, 93 blind spot, 95 boundary portion, 100 molding device, 101 lower mold, 102 upper mold, 103 plunger, 104 resin injection port, 105 movable pin, 110 electrostatic spray mechanism, 111 nozzle, 112 nozzle opening, 113 compressed air inlet, 114 pipe, 115 pressure regulating mechanism, 116 compressed air supply port, 117 electric line of force, 120 stage, 130 DBC board, 131 insulating layer, 132 copper foil, 133, 133A, 133B copper plate, 200 power conversion device, 201 main conversion circuit, 202 power semiconductor module, 203 control circuit, 300 load, 400 power supply, GND ground, GP gap, PWR high-voltage power supply.

The invention claimed is:

1. A power semiconductor device comprising:
a lead member;
a semiconductor element placed on the lead member; and
a mold resin sealing the semiconductor element, wherein
the lead member includes a plurality of lead terminals, the lead terminals extending from inside to outside of the mold resin,
each of the lead terminals includes a base portion and a tip end portion on the outside of the mold resin, the base portion being disposed on a region side having the semiconductor element, and extending in a direction protruding from the mold resin, the tip end portion extending in a direction different from the base portion and being disposed on an opposite side to a region having the semiconductor element as viewed from the base portion,
a length by which the base portion extends differs between a pair of lead terminals adjacent to each other, among the lead terminals, and
at least a surface of the base portion of each of the lead terminals is covered with a coating resin,
each of the lead terminals has a die pad portion having the semiconductor element thereon, and
the coating resin is formed on at least both the surface of the base portion and a surface of the die pad portion on an opposite side to a surface having the semiconductor element thereon.

2. The power semiconductor device according to claim 1, wherein
the coating resin is formed at the die pad portion, and
the coating resin is formed on the surface of the die pad portion on the opposite side to the surface having the semiconductor element thereon.

3. The power semiconductor device according to claim 2, wherein the coating resin at the die pad portion is formed only on the surface on the opposite side.

4. The power semiconductor device according to claim 1, wherein
the lead terminals each are bent at a step portion between the die pad portion and the base portion on the inside of the mold resin, and
the die pad portion is disposed on an opposite side to the tip end portion as viewed from the base portion.

5. The power semiconductor device according to claim 4, wherein
an outer surface of the mold resin has a mold resin step portion at which the outer surface is partially bent, and
the mold resin step portion is a region in which an extending and expanding direction of the outer surface is a direction different from a region surrounding the mold resin step portion.

6. The power semiconductor device according to claim 1, wherein the coating resin is formed to cover a part of a surface of the mold resin.

7. The power semiconductor device according to claim 1, wherein each of the lead terminals has a bent portion at the tip end portion.

8. The power semiconductor device according to claim 1, further comprising a circuit board, wherein
a wiring portion having electrical continuity with each of the lead terminals is formed on the circuit board, and
at least a part of the wiring portion is covered with the coating resin.

9. The power semiconductor device according to claim 1, wherein the coating resin has a thermal conductivity higher than a thermal conductivity of air.

10. A power conversion device comprising:
a main conversion circuit to convert input power and output the converted power, the main conversion circuit including the power semiconductor device according to claim 1; and
a control circuit to output a control signal to the main conversion circuit for controlling the main conversion circuit.

11. A method of manufacturing a power semiconductor device,
the method comprising forming a coating resin for a member including a semiconductor element sealed with resin, in a state in which the semiconductor element is placed on a lead member, wherein
the lead member is cut into a plurality of lead terminals, the lead terminals extending from inside to outside of a mold resin formed of the resin,
each of the cut lead terminals includes a base portion and a tip end portion on the outside of the mold resin, the base portion being disposed on a region side having the semiconductor element, and extending in a direction protruding from the mold resin, the tip end portion extending in a direction different from the base portion and being disposed on an opposite side to a region having the semiconductor element as viewed from the base portion,
a length by which the base portion extends differs between a pair of lead terminals adjacent to each other, among the lead terminals,
at least a surface of the base portion of each of the lead terminals is covered with the coating resin in forming the coating resin, and
in forming the coating resin, a charged resin material diffused into a spray is formed on a surface of the base portion,
each of the lead terminals has a die pad portion having the semiconductor element thereon, and
the coating resin is formed on at least both the surface of the base portion and a surface of the die pad portion on an opposite side to a surface having the semiconductor element thereon.

12. The method of manufacturing a power semiconductor device according to claim 11, wherein
each of the lead terminals has a die pad portion having the semiconductor element thereon, and
in forming the coating resin, the die pad portion is grounded.

13. The method of manufacturing a power semiconductor device according to claim 11, wherein
forming the coating resin is performed in a state in which at least a part of the member is mounted on a circuit board, and
in forming the coating resin, the coating resin is formed to cover at least a part of a wiring portion formed on the circuit board and having electrical continuity with each of the lead terminals.

14. The method of manufacturing a power semiconductor device according to claim 11, wherein in forming the coating resin, an electrostatic spray mechanism diffuses the resin material, and the electrostatic spray mechanism diffuses the resin material while moving in the direction in which each of the plurality of lead terminals protrudes from the mold resin.

* * * * *